US012641829B2

(12) United States Patent
More

(10) Patent No.: US 12,641,829 B2
(45) Date of Patent: May 26, 2026

(54) BUFFER EPITAXIAL REGION IN SEMICONDUCTOR DEVICES AND MANUFACTURING METHOD OF THE SAME

(71) Applicant: Taiwan Semiconductor Manufacturing Company, Ltd., Hsin-Chu (TW)

(72) Inventor: Shahaji B. More, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 606 days.

(21) Appl. No.: 18/163,649

(22) Filed: Feb. 2, 2023

(65) Prior Publication Data

US 2023/0326989 A1    Oct. 12, 2023

Related U.S. Application Data

(60) Provisional application No. 63/382,256, filed on Nov. 3, 2022, provisional application No. 63/328,570, filed on Apr. 7, 2022.

(51) Int. Cl.
  H10D 30/67     (2025.01)
  H10D 64/01     (2025.01)
      (Continued)

(52) U.S. Cl.
  CPC ..... H10D 30/6735 (2025.01); H10D 30/6757 (2025.01); H10D 64/017 (2025.01);
      (Continued)

(58) Field of Classification Search
  CPC ........... H10D 30/6735; H10D 30/6757; H10D 64/017; H10D 64/018; H10D 84/0128;
      (Continued)

(56) References Cited

U.S. PATENT DOCUMENTS 7,208,815 B2    4/2007  Chen et al.
7,618,891 B2    11/2009  Fang et al.
          (Continued)

OTHER PUBLICATIONS

J. Chen, T. Saraya and T. Hiramoto, "Hole Mobility Characteristics in Si Nanowire pMOSFETs on (110) Silicon-on-Insulator," in IEEE Electron Device Letters, vol. 31, No. 11, pp. 1181-1183, Nov. 2010, doi: 10.1109/LED.2010.2064154. (Year: 2010).*

*Primary Examiner* — Jeff W Natalini
*Assistant Examiner* — Rose Keagy
(74) *Attorney, Agent, or Firm* — HAYNES AND BOONE, LLP

(57)          ABSTRACT

A method includes forming a semiconductor fin protruding from a semiconductor substrate. The semiconductor fin has an epitaxial portion and a mesa portion under the epitaxial portion. The epitaxial portion has a plurality of channel layers interleaved with a plurality of sacrificial layers. The semiconductor substrate has a top surface in (110) crystal plane. The method also includes forming a dummy gate structure across the semiconductor fin, removing at least the epitaxial portion of the semiconductor fin in a region adjacent the dummy gate structure to form a recess, epitaxially growing a buffer semiconductor region in the recess, epitaxially growing a source/drain feature on the buffer semiconductor region, and replacing the dummy gate structure with a metal gate structure. The buffer semiconductor region has a top surface in (110) crystal plane.

20 Claims, 30 Drawing Sheets

(51) Int. Cl.
      *H10D 84/01*         (2026.01)
      *H10D 84/03*         (2025.01)

(52) U.S. Cl.
      CPC ....... *H10D 64/018* (2025.01); *H10D 84/0128*
              (2025.01); *H10D 84/013* (2025.01); *H10D*
              *84/0158* (2025.01); *H10D 84/038* (2025.01)

(58) Field of Classification Search
      CPC ............. H10D 84/013; H10D 84/0158; H10D
                        84/038; H10D 84/0151
      See application file for complete search history.

(56)                    References Cited

U.S. PATENT DOCUMENTS

| | | |
|---|---|---|
| 7,704,809 B2 | 4/2010 | Yeo et al. |
| 9,859,381 B2 | 1/2018 | Li et al. |
| 10,964,798 B2 | 3/2021 | Cheng et al. |
| 11,205,598 B2 | 12/2021 | Lee |
| 11,309,385 B2 | 4/2022 | Peng et al. |
| 2017/0317213 A1* | 11/2017 | Park .................... H01L 21/0217 |
| 2018/0175172 A1 | 6/2018 | Chang et al. |
| 2019/0252266 A1 | 8/2019 | Chen et al. |
| 2021/0320210 A1* | 10/2021 | Lin .................... H10D 30/6757 |
| 2021/0375857 A1* | 12/2021 | Huang ................. H10D 30/014 |
| 2021/0391423 A1* | 12/2021 | Lin ........................ H10D 30/43 |
| 2022/0052203 A1 | 2/2022 | More |
| 2022/0069076 A1 | 3/2022 | Yu et al. |
| 2022/0069135 A1 | 3/2022 | Chu et al. |

* cited by examiner

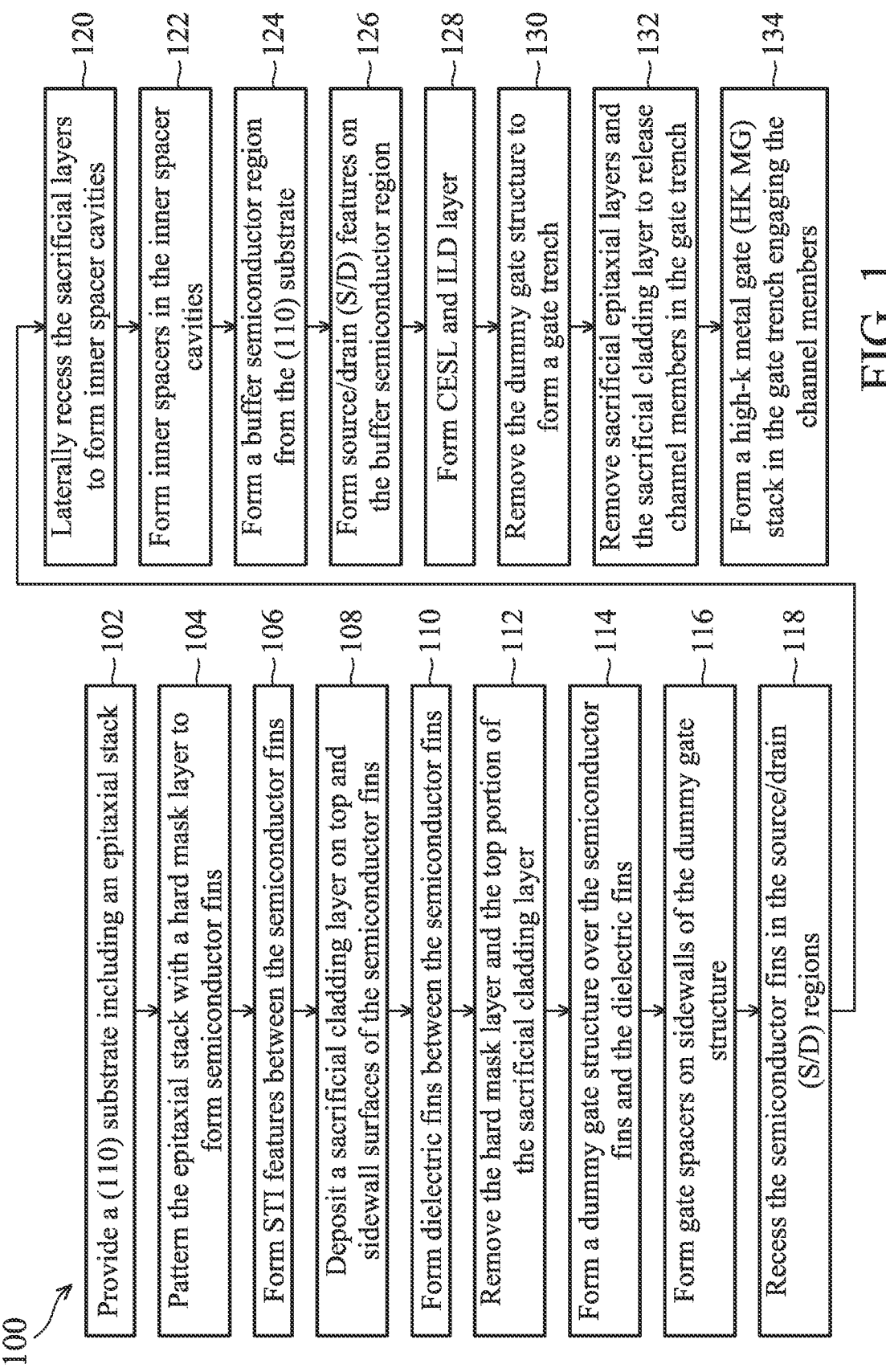

FIG. 1

120 — Laterally recess the sacrificial layers to form inner spacer cavities

122 — Form inner spacers in the inner spacer cavities

124 — Form a buffer semiconductor region from the (110) substrate

126 — Form source/drain (S/D) features on the buffer semiconductor region

128 — Form CESL and ILD layer

130 — Remove the dummy gate structure to form a gate trench

132 — Remove sacrificial epitaxial layers and the sacrificial cladding layer to release channel members in the gate trench 134 — Form a high-k metal gate (HK MG) stack in the gate trench engaging the channel members

100

102 — Provide a (110) substrate including an epitaxial stack

104 — Pattern the epitaxial stack with a hard mask layer to form semiconductor fins 106 — Form STI features between the semiconductor fins 108 — Deposit a sacrificial cladding layer on top and sidewall surfaces of the semiconductor fins 110 — Form dielectric fins between the semiconductor fins 112 — Remove the hard mask layer and the top portion of the sacrificial cladding layer 114 — Form a dummy gate structure over the semiconductor fins and the dielectric fins 116 — Form gate spacers on sidewalls of the dummy gate structure 118 — Recess the semiconductor fins in the source/drain (S/D) regions

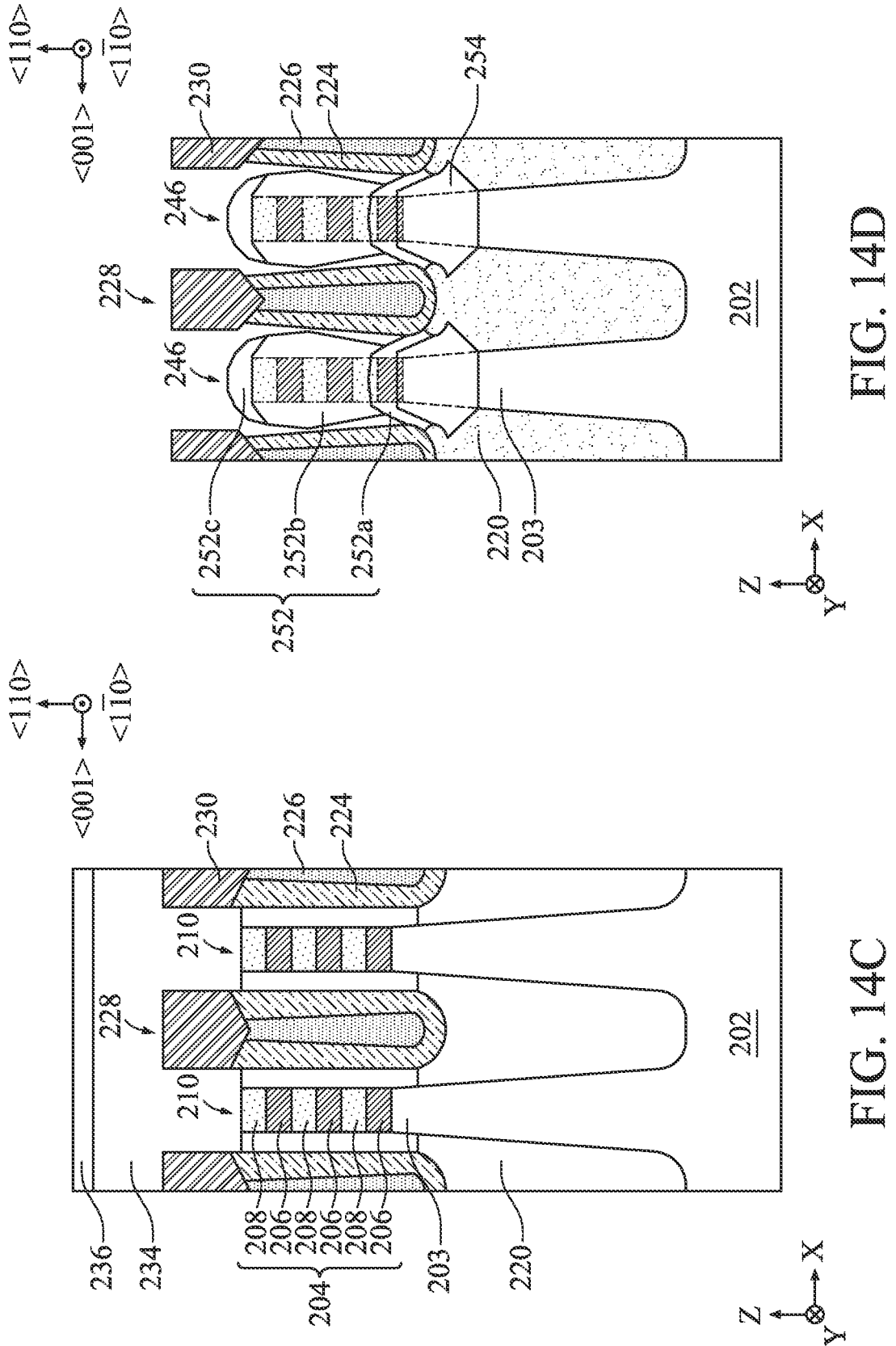

BUFFER EPITAXIAL REGION IN SEMICONDUCTOR DEVICES AND MANUFACTURING METHOD OF THE SAME

PRIORITY DATA

This application claims priority to U.S. Provisional Patent Application No. 63/328,570 filed on Apr. 7, 2022 and U.S. Provisional Patent Application No. 63/382,256 filed on Nov. 3, 2022, the entire disclosures of which are incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as IC technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Gate-all-around (GAA) transistors are examples of multi-gate devices that have become popular and promising candidates for high-performance and low-leakage applications. GAA transistors get their name from the gate structures which can extend around the channel region providing access to the stacked channel layers on four sides. Compared to planar transistors, such configuration provides better control of the channel region and drastically reduces SCEs (in particular, by reducing sub-threshold leakage). As the semiconductor industry further progresses into sub-10 nanometer (nm) technology process nodes in pursuit of higher device density, higher performance, and lower costs, integration of fabricating the GAA features around stacked channel layers can be challenging. For example, among GAA features, a gate structure extending around the bottommost channel layer may also engage a top portion of the semiconductor substrate thereunder, causing strong leakage current under the stacked channel layers. Therefore, while the current methods have been satisfactory in many respects, challenges with respect to performance of the resulting device may not be satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1 shows a flow chart of a method for forming a multi-gate device, according to one or more aspects of the present disclosure.

FIGS. 2A, 3A, 4A, 5A, 6A, 7A, 8A, 9A, 10A, 11A, 12A, 13A, 14A, 15A, 16A, 17A, 18A, and 19A illustrate perspective views of a semiconductor structure during a fabrication process according to the method of FIG. 1, according to aspects of the present disclosure.

FIGS. 2B, 3B, 4B, 5B, 6B, 7B, 8B, 9B, 9C, 9D, 10B, 10C, 10D, 11B, 11C, 11D, 12B, 12C, 12D, 13B, 13C, 13D, 14B, 14C, 14D, 15B, 15C, 15D, 16B, 16C, 16D, 17B, 17C, 17D, 18B, 18C, 18D, 19B, 19C, and 19D illustrate cross-sectional views of a semiconductor structure during a fabrication process according to the method of FIG. 1, according to aspects of the present disclosure.

DETAILED DESCRIPTION

Figure 2B:
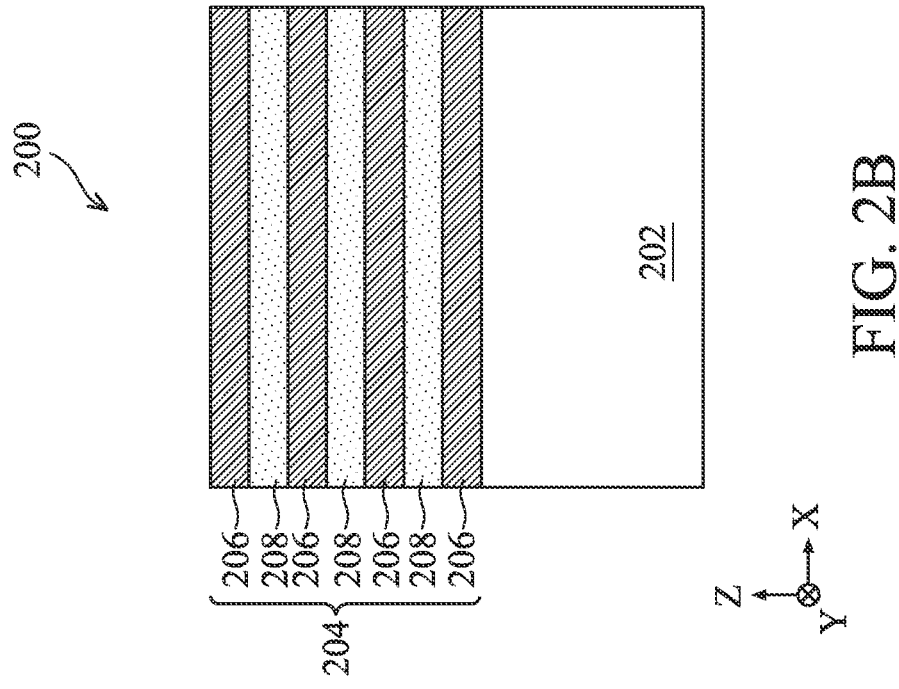

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to semiconductor fabrication of multi-gate transistors in a semiconductor device. As used herein, a semiconductor device refers to, for example, one or more transistors, integrated circuits, a semiconductor chip (e.g., memory chip, logic chip on a semiconductor die), a stack of semiconductor chips, a semiconductor package, a semiconductor wafer, and the like. The term "multi-gate transistor" refers to a transistor, such as a field effect transistor (FET) that has gate material(s) disposed on multiple sides of a channel region of the transistor.

A GAA transistor is a type of multi-gate transistor that has a gate structure extending around the channel region providing access to the stacked channel layers on four sides. The details of the structure and fabrication methods of the present disclosure are described below in conjunction with the accompanied drawings, which illustrate a process of making GAA transistors, according to some embodiments. A GAA transistor has vertically-stacked horizontally-oriented channel layers. The term "channel layer" is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. In some examples, the channel layer is referred to as a "nanowire", a "nanosheet", and the like that as used herein includes channel layers of various geometries (e.g., cylindrical, bar-shaped) and various dimensions. GAA transistors are promising candidates to take CMOS to the next stage of the roadmap due to their better gate control ability, lower leakage current, and fully FinFET device layout compatibility. For the purposes of simplicity, the present disclosure uses GAA devices as an example. Those of ordinary skill in the art should appreciate that they may readily use the present disclosure as a basis for designing or modifying other processes and structures (such as other types of multi-gate transistors) for carrying out the same purposes and/or achieving the same advantages of the embodiments introduced herein.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods and structures for providing a buffer semiconductor region between a source/drain (S/D) epitaxial feature and a semiconductor substrate having a (110) crystal orientation, which substrate is referred to as a (110) substrate (that is, a top surface of the semiconductor substrate is in a (110) plane). S/D epitaxial feature(s) (or termed as S/D region(s)) may refer to a source or a drain, individually or collectively upon the context. Among GAA features, a gate structure extending around the stacked channel structures may also directly engage a top portion of a semiconductor substrate under the bottommost channel layer (or referred to as a fin-shape base or a mesa). Dopants from the S/D epitaxial features may diffuse into the mesa and leads to strong leakage current flowing into the semiconductor substrate when a gate drive voltage is applied. The buffer semiconductor region blocks dopant in the S/D epitaxial features from diffusing into the mesa and thus suppresses the leakage current through the mesa.

Generally, GAA features are formed on a semiconductor substrate having a (100) crystal orientation, which substrate is referred to as a (100) substrate (that is, a top surface of the semiconductor substrate is in a (100) plane). If the buffer semiconductor region is epitaxially grown from a (100) crystal plane, as the deposition rate along <100> direction is much faster than along <111> direction, the resulting shape of the buffer semiconductor region may not sufficiently cover sidewalls of the mesa and ineffectively prevent dopant diffusion from the S/D epitaxial features. Insufficient buffer semiconductor region lateral growth along <110> direction may also leave space between shallow trench isolation (STI) features and the mesa, which may also cause dopant diffusion into the mesa. As a comparison, in embodiments of the present disclosure, the semiconductor substrate has a (110) crystal orientation, and the buffer semiconductor region is epitaxially grown from a (110) crystal plane. The deposition rate mismatch between <110> and <111> directions is much less. The resulting shape of the buffer semiconductor region sufficiently covers sidewalls of the mesa and fills space between STI features and the mesa.

The various aspects of the present disclosure will now be described in more detail with reference to the figures. Illustrated in FIG. 1 is a method 100 of semiconductor fabrication including fabrication of multi-gate devices. The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method. The method 100 is described below in conjunction with FIGS. 2A-19D. FIGS. 2A, 3A, 4A, 5A, 6A, 7A, 8A, 9A, 10A, 11A, 12A, 13A, 14A, 15A, 16A, 17A, 18A, and 19A represent perspective views of an embodiment of a semiconductor device 200 according to various stages of the method 100 of FIG. 1. FIGS. 2B, 3B, 4B, 5B, 6B, 7B, 8B are cross-sectional views taken in the X-Z plane along the B-B line in the corresponding figures numbered with suffix "A", which cut through a gate region and perpendicular to a lengthwise direction of a channel region of the to-be-formed multi-gate device. FIGS. 9B, 10B, 11B, 12B, 13B, 14B, 15B, 16B, 17B, 18B, and 19B are cross-sectional views taken in the Y-Z plane along the B-B line in the corresponding figures numbered with suffix "A", which cut through a channel region and adjacent source/drain regions of the to-be-formed multi-gate device. FIGS. 9C, 10C, 11C, 12C, 13C, 14C, 15C, 16C, 17C, 18C, and 19C are cross-sectional views taken in the X-Z plane along the C-C line in the corresponding figures numbered with suffix "A", which cut through a gate region and perpendicular to a lengthwise direction of a channel region of the to-be-formed multi-gate device. FIGS. 9D, 10D, 11D, 12D, 13D, 14D, 15D, 16D, 17D, 18D, and 19D are cross-sectional views taken in the X-Z plane along the D-D line in the corresponding figures numbered with suffix "A", which cut through a source/drain region and perpendicular to a lengthwise direction of a channel region of the to-be-formed multi-gate device.

As with the other method embodiments and exemplary devices discussed herein, it is understood that parts of the semiconductor device 200 may be fabricated by a CMOS technology process flow, and thus some processes are only briefly described herein. Further, the exemplary semiconductor devices may include various other devices and features, such as other types of devices such as additional transistors, bipolar junction transistors, resistors, capacitors, inductors, diodes, fuses, static random access memory (SRAM) and/or other logic circuits, etc., but is simplified for a better understanding of the inventive concepts of the present disclosure. In some embodiments, the exemplary devices include a plurality of semiconductor devices (e.g., transistors), including P-FETs, N-FETs, etc., which may be interconnected. Moreover, it is noted that the process steps of method 100, including any descriptions given with reference to FIGS. 2A-19D, as with the remainder of the method and exemplary figures provided in this disclosure, are merely exemplary and are not intended to be limiting beyond what is specifically recited in the claims that follow.

Figure 2A:
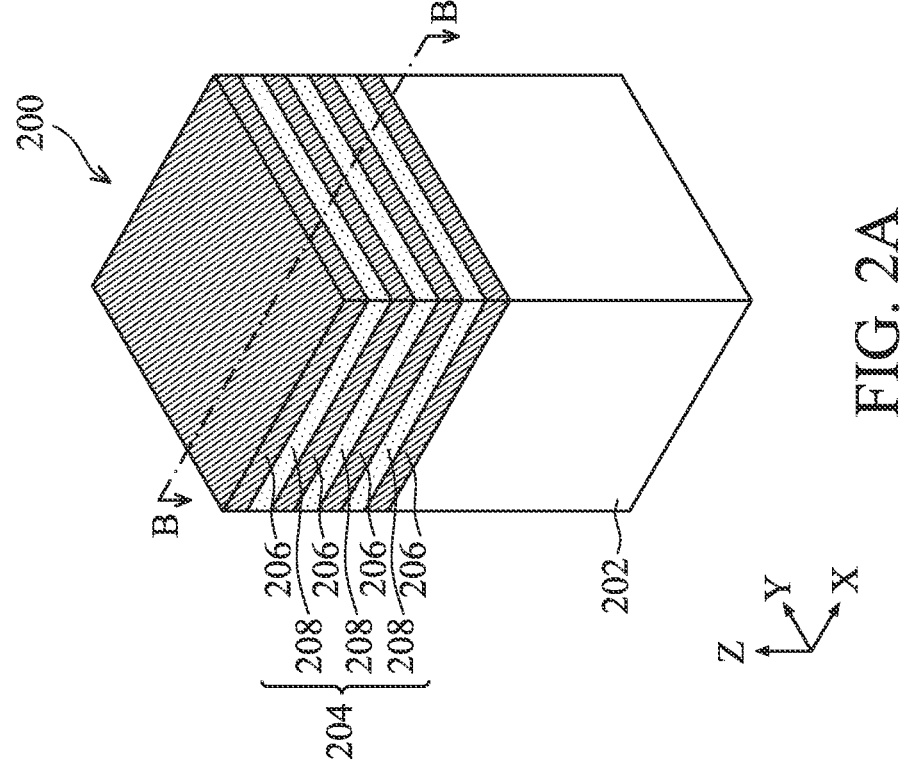

The method 100 at operation 102 (FIG. 1) provides (or is provided with) a semiconductor device (or device) 200. Referring to FIGS. 2A and 2B, the device 200 includes a substrate 202 and an epitaxial stack 204 above the substrate 202. In some embodiments, the substrate 202 may be a semiconductor substrate such as a silicon substrate. The substrate 202 may include various layers, including conductive or insulating layers formed on a semiconductor substrate. The substrate 202 may include various doping configurations depending on design requirements as is known in the art. For example, different doping profiles (e.g., n-wells, p-wells) may be formed on the substrate 202 in regions designed for different device types (e.g., n-type field effect transistors (N-FET), p-type field effect transistors (P-FET)). The suitable doping may include ion implantation of dopants and/or diffusion processes. The substrate 202 may have isolation features (e.g., shallow trench isolation (STI) features) interposing the regions providing different device types. The substrate 202 may also include other semiconductors such as germanium, silicon carbide (SiC), silicon germanium (SiGe), or diamond. Alternatively, the substrate 202 may include a compound semiconductor and/or an alloy semiconductor. Further, the substrate 202 may optionally include an epitaxial layer (epi-layer), may be strained for performance enhancement, may include a silicon-on-insulator (SOI) structure, and/or may have other suitable enhancement features. In the present embodiment, the substrate 202 is a crystalline silicon substrate with a top surface in a (110) plane. The substrate 202 is also referred to as a (110) substrate.

The epitaxial stack 204 includes epitaxial layers 206 of a first composition interposed by epitaxial layers 208 of a second composition. The first and second compositions can be different. The epitaxial layers 208 may include the same composition as the substrate 202. In the illustrated embodiment, the epitaxial layers 206 are silicon germanium (SiGe) and the epitaxial layers 208 are silicon (Si). However, other embodiments are possible including those that provide for a first composition and a second composition having different oxidation rates and/or etch selectivity. For example, in some embodiments, either of the epitaxial layers 206, 208 of the first composition or the second composition may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. In some embodiments, the epitaxial layers 206 and 208 are substantially dopant-free (i.e., having an extrinsic dopant concentration from about 0 cm$^{-3}$ to about $1\times10^{17}$ cm$^{-3}$), where for example, no intentional doping is performed during the epitaxial growth process. By way of example, epitaxial growth of the epitaxial layers 206 and 208 of the respective first and second compositions may be performed by a molecular beam epitaxy (MBE) process, a metalorganic chemical vapor deposition (MOCVD) process, and/or other suitable epitaxial growth processes. In various embodiments, the substrate 202 is a (110) substrate, and the epitaxial layers 206 and 208 each are accordingly crystalline semiconductor layers with a top surface in a (110) plane.

In some embodiments, each epitaxial layer 206 has a thickness ranging from about 4 nanometers (nm) to about 8 nm. The epitaxial layers 206 may be substantially uniform in thickness. Yet the top epitaxial layer 206 may be thinner (e.g., half the thickness) than other epitaxial layers 206 thereunder in some embodiments. The top epitaxial layer 206 functions as a capping layer providing protections to other epitaxial layers in subsequent processes. In some embodiments, each epitaxial layer 208 has a thickness ranging from about 4 nm to about 8 nm. In some embodiments, the epitaxial layers 208 of the stack are substantially uniform in thickness. As described in more detail below, the epitaxial layers 208 or portions thereof may form channel member(s) of the subsequently-formed multi-gate device

200 and the thickness is chosen based on device performance considerations. The term channel member(s) (or channel layer(s)) is used herein to designate any material portion for channel(s) in a transistor with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. The epitaxial layers 206 in channel regions(s) may eventually be removed and serve to define a vertical distance between adjacent channel members for a subsequently-formed multi-gate device and the thickness is chosen based on device performance considerations. Accordingly, the epitaxial layers 206 may also be referred to as sacrificial layers, and epitaxial layers 208 may also be referred to as channel layers.

It is noted that four (4) layers of the epitaxial layers 206 and three (3) layers of the epitaxial layers 208 are alternately arranged as illustrated in FIGS. 2A and 2B, which is for illustrative purposes only and not intended to be limiting beyond what is specifically recited in the claims. It can be appreciated that any number of epitaxial layers can be formed in the epitaxial stack 204; the number of layers depending on the desired number of channels members for the device 200. In some embodiments, the number of epitaxial layers 208 is between 2 and 10. It is also noted that while the epitaxial layers 206, 208 are shown as having a particular stacking sequence, where an epitaxial layer 206 is the topmost layer of the epitaxial stack 204, other configurations are possible. For example, in some cases, an epitaxial layer 208 may alternatively be the topmost layer of the epitaxial stack 204. Stated another way, the order of growth for the epitaxial layers 206, 208, and thus their stacking sequence, may be switched or otherwise be different than what is shown in the figures, while remaining within the scope of the present disclosure.

The method 100 then proceeds to operation 104 (FIG. 1) where semiconductor fins (also referred to as device fins or fin elements) are formed by patterning. With reference to the example of FIGS. 3A and 3B, in an embodiment of operation 104, a plurality of semiconductor fins 210 extending from the substrate 202 are formed. In various embodiments, each of the semiconductor fins 210 includes a fin-like base 203 (also referred to as mesa) formed from the substrate 202 and an epitaxial stack portion 204 formed from portions of each of the epitaxial layers of the epitaxial stack including epitaxial layers 206 and 208. The semiconductor fins 210 may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the semiconductor fins 210 by etching initial epitaxial stack 204. The etching process can include dry etching, wet etching, reactive ion etching (RIE), and/or other suitable processes.

In the illustrated embodiment, a hard mask (HM) layer 212 is formed over the epitaxial stack 204 prior to patterning the semiconductor fins 210. In some embodiments, the HM layer 212 includes an oxide layer 212A (e.g., a pad oxide layer that may include silicon oxide) and a nitride layer 212B (e.g., a pad nitride layer that may include silicon nitride) formed over the oxide layer 212A. The oxide layer 212A may act as an adhesion layer between the epitaxial stack 204 and the nitride layer 212B and may act as an etch stop layer for etching the nitride layer 212B. In some examples, the HM layer 212 includes thermally grown oxide, chemical vapor deposition (CVD)-deposited oxide, and/or atomic layer deposition (ALD)-deposited oxide. In some embodiments, the HM layer 212 includes a nitride layer deposited by CVD and/or other suitable technique.

Figures 3A, 3B:
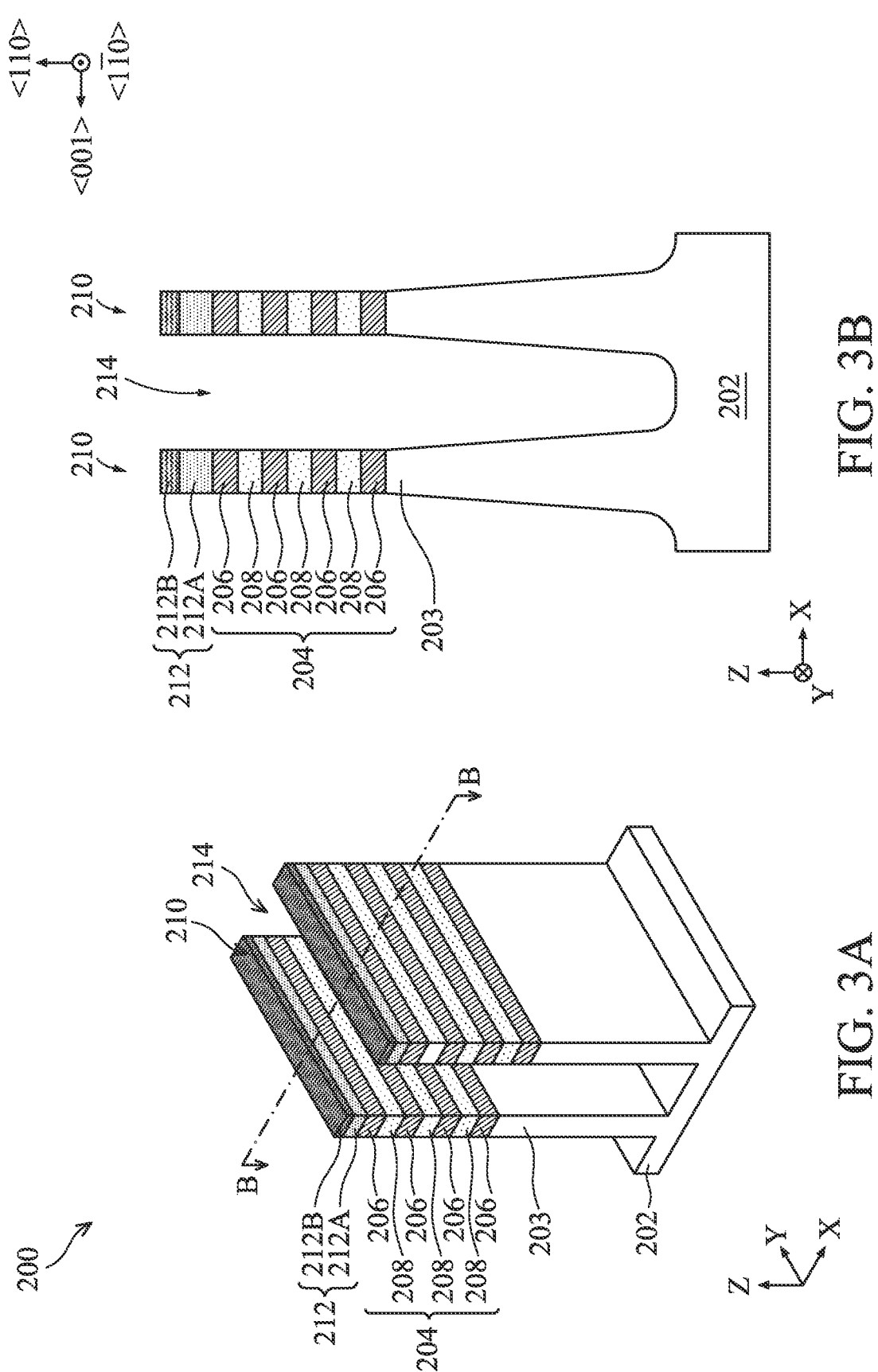

The semiconductor fins 210 may subsequently be fabricated using suitable processes including photolithography and etch processes. The photolithography process may include forming a photoresist layer (not shown) over the HM layer 212, exposing the resist to a pattern, performing post-exposure bake processes, and developing the resist to form a masking element including the resist. In some embodiments, patterning the resist to form the masking element may be performed using an electron beam (e-beam) lithography process. The masking element may then be used to protect regions of the substrate 202, and layers formed thereupon, while an etch process forms trenches 214 in unprotected regions through the HM layer 212, through the epitaxial stack 204, and into the substrate 202, thereby leaving the plurality of extending semiconductor fins 210. The trenches 214 may be etched using dry etching, wet etching, RIE, and/or other suitable processes. In some examples, a width of the semiconductor fin 210 measured along the X-axis ranges from about 20 nm to about 30 nm. The lengthwise direction of the semiconductor fins 210 as depicted in FIG. 3B is in and out of the paper along the Y-axis, which is the <1T0> crystalline direction.

Numerous other embodiments of methods to form the semiconductor fins on the substrate may also be used including, for example, defining the fin region (e.g., by mask or isolation regions) and epitaxially growing the epitaxial stack 204 in the form of the semiconductor fins 210. In some embodiments, forming the semiconductor fins 210 may include a trim process to decrease the width of the semiconductor fins 210. The trim process may include wet and/or dry etching processes.

Figures 4A, 4B:
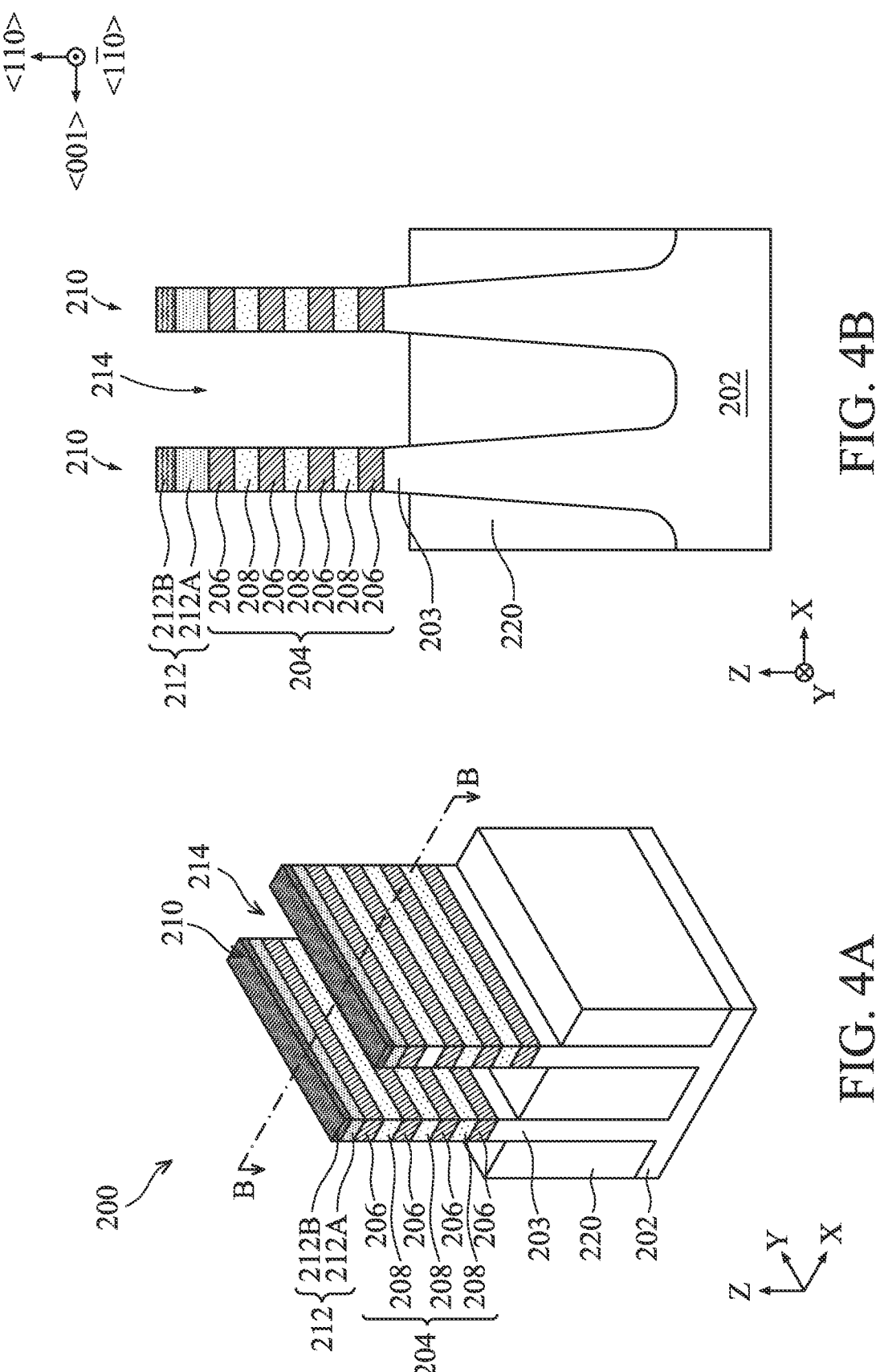

At operation 106, the method 100 (FIG. 1) forms isolation features, such as shallow trench isolation (STI) features, between the semiconductor fins 210. Referring to FIGS. 4A and 4B, STI features 220 is disposed on the substrate 202 interposing the semiconductor fins 210. By way of example, in some embodiments, a dielectric layer is first deposited over the substrate 202, filling the trenches 214 with dielectric material. In some embodiments, the dielectric layer may include silicon oxide, silicon nitride, silicon oxynitride, fluorine-doped silicate glass (FSG), a low-k dielectric, combinations thereof, and/or other suitable materials. In various examples, the dielectric layer may be deposited by a CVD process, a SACVD process, a flowable CVD process, an ALD process, a PVD process, and/or other suitable process. In some embodiments, after deposition of the dielectric layer, the device 200 may be annealed, for example, to improve the quality of the dielectric layer. In some embodiments, the dielectric layer may include a multi-layer structure, for example, having one or more liner layers.

In some embodiments of forming the isolation (STI) features, after deposition of the dielectric layer, the deposited dielectric material is thinned and planarized, for example by a chemical mechanical polishing (CMP) process. In some embodiments, the HM layer 212 functions as a CMP stop layer. Subsequently, the dielectric layer interposing the semiconductor fins 210 are recessed. Still referring to the example of FIGS. 4A and 4B, the STI features 220 are recessed providing the semiconductor fins 210 extending above the STI features 220. In some embodiments, the recessing process may include a dry etching process, a wet etching process, and/or a combination thereof. In some embodiments, a recessing depth is controlled (e.g., by controlling an etching time) so as to result in a desired height of the exposed upper portion of the semiconductor fins 210. In the illustrated embodiment, the desired height exposes each of the layers of the epitaxial stack 204. In furtherance of the embodiment, a top surface of the STI features 220 is recessed below the bottommost epitaxial layer 206.

Figures 5A, 5B:
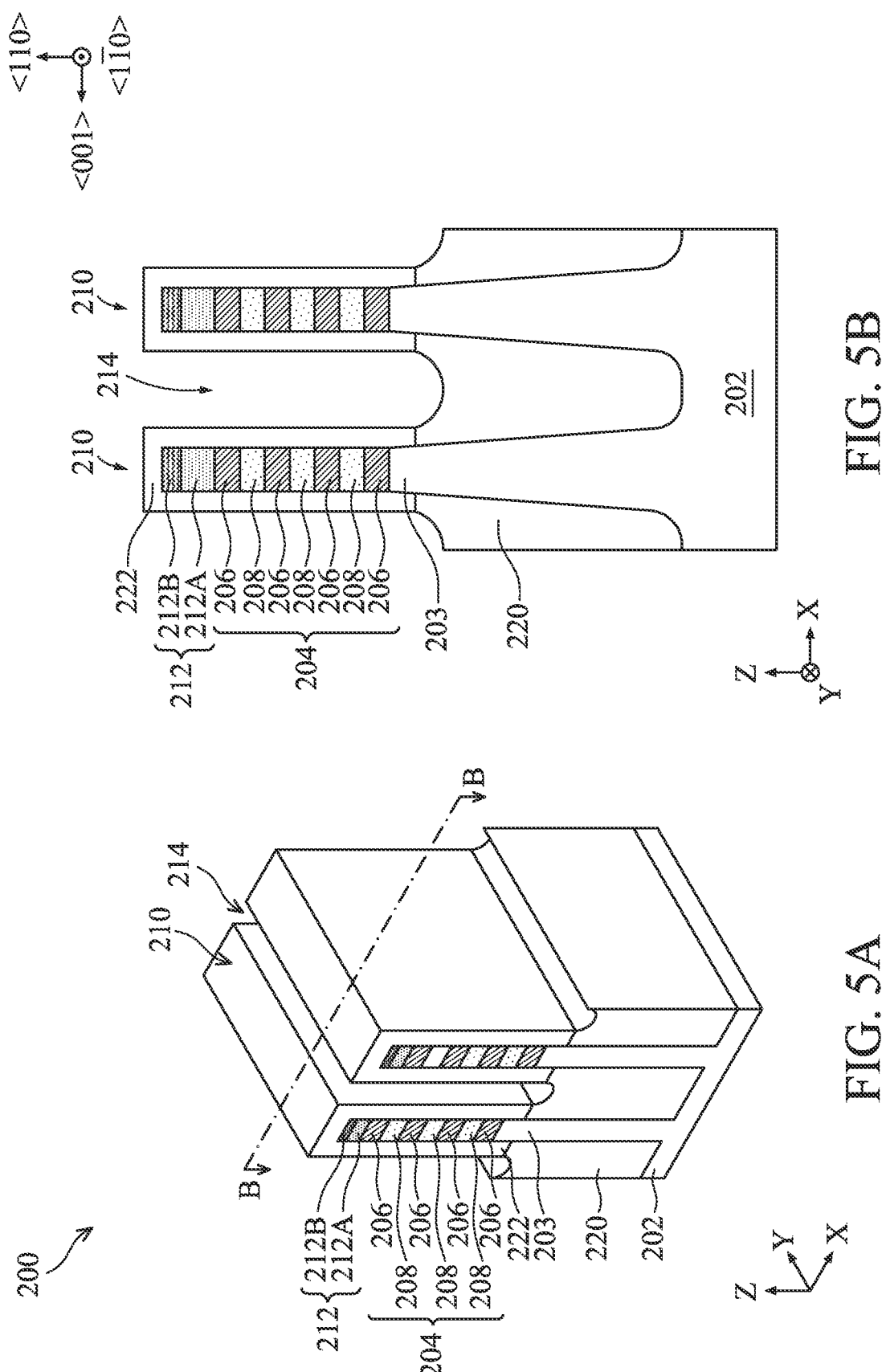

At operation 108, the method 100 (FIG. 1) deposits a cladding layer on top and sidewall surfaces of the semiconductor fins. Referring to FIGS. 5A and 5B, in the illustrated embodiment, the cladding layer 222 is selectively deposited over the device 200. In particular, the cladding layer 222 may be selectively and conformally deposited over the exposed surfaces of the semiconductor fins 210. In various embodiments, the cladding layer 222 is not deposited on top surfaces of the STI features 220 between the semiconductor fins 210. For example, the cladding layer 222 may be a semiconductor layer and deposited by an epitaxial growing process, such that the epitaxial growth of the cladding layer 222 is limited to exposed semiconductor surfaces of the semiconductor fins 210, which functions as a seed layer, but not on dielectric material surfaces of the STI features 220. Alternatively, the cladding layer 222 may be deposited as a blanket layer covering the device 200. Subsequently, horizontal portions of the cladding layer 222 are removed in an anisotropic etch process, such as a dry etching process (e.g., RIE etching), leaving remaining portions on top and sidewall surfaces of the semiconductor fins 210. The anisotropic etch process exposes the top surface of the STI features 220 in the trenches 214. The exposed top surface of the STI features 220 may have some etch loss due to limited etch contrast and have a dishing profile located at the bottom of the trenches 214. By way of example, the cladding layer 222 may be deposited by an MBE process, an MOCVD process, an ALD process, and/or other suitable deposition processes. As will be explained in detail below, the cladding layer 222 reserves a space for subsequently formed metal gate stack and will be removed in a subsequent processing stage. Therefore, the cladding layer 222 is also referred to as a sacrificial cladding layer. In some examples, a thickness of the cladding layer 222 ranges from about 5 nm to about 20 nm.

In some embodiments, the cladding layer 222 includes the same semiconductor material as the epitaxial layers 206, such as silicon germanium (SiGe), but in difference germanium concentrations. For example, the molar ratio of germanium may range from about 15% to about 25% in the epitaxial layers 206, and the molar ratio of germanium may range from about 40% to about 50% in the cladding layer 222. The difference in germanium concentration provides etch selectivity between the cladding layer 222 and the epitaxial layers 206. In some alternative embodiments, the cladding layer 222 includes the same semiconductor material as the epitaxial layers 206, such as silicon germanium (SiGe), including the same germanium concentration. In furtherance of the embodiment, an oxide liner (not shown) may be formed on exposed semiconductor surfaces of the semiconductor fins 210 prior to the deposition of the cladding layer 222. The oxide liner separates the cladding layer 222 from the epitaxial layers 206 and protects the epitaxial layers 206 in subsequent removal of the cladding layer 222. The oxide liner is formed by oxidizing exposed semiconductor surfaces of the semiconductor fins 210. The oxidation process results in the oxide liner having a determined thickness. For example, the oxide liner may have a thickness from about 1 nm to about 3 nm. In some embodiments, the oxidation process comprises a rapid thermal oxidation (RTO) process, high pressure oxidation (HPO), chemical oxidation process, in-situ stream generation (ISSG) process, or enhanced in-situ stream generation (EISSG) process. In some embodiments, the RTO process is performed at a temperature of about 400° C. to about 700° C., using $O_2$ and $O_3$ as reaction gases, for about 1 second to about 30 seconds. In other embodiments, an HPO is performed using a process gas of $O_2$, $O_2+N_2$, $N_2$, or the like, at a pressure from about 1 atm to about 25 atm and a temperature from about 300° C. to about 700° C., for about 1 minute to about 10 minutes. Examples of a chemical oxidation process include wet SPM clean, wet $O_3/H_2O$, or the like. The $O_3$ may have a concentration of about 1 ppm to about 50 ppm.

In some embodiments, the semiconductor material in the cladding layer 222 is in either amorphous form or polycrystalline form, such as amorphous SiGe or polycrystalline SiGe in some embodiments. In yet some embodiments, the cladding layer 222 may have a mixture of semiconductor material in both amorphous form and polycrystalline form, such as 60% SiGe in amorphous form and 40% SiGe in polycrystalline form. The term "amorphous or polycrystalline" is used herein to designate composition in amorphous form, polycrystalline form, or a combination thereof.

Figures 6A, 6B:
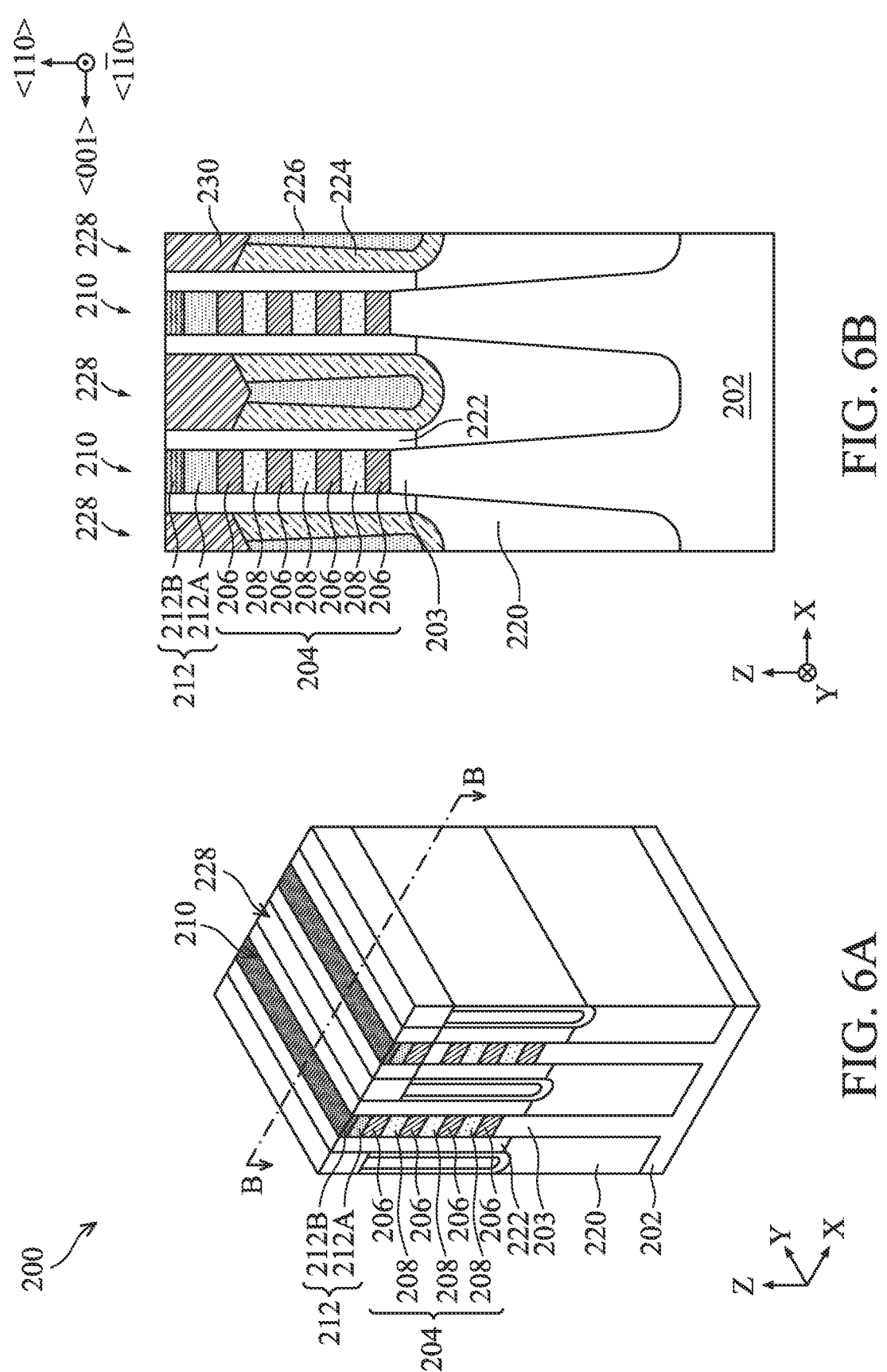

At operation 110, the method 100 (FIG. 1) forms dielectric fins between adjacent semiconductor fins. Referring to FIGS. 6A and 6B, in an embodiment of operation 110, a dielectric layer 224 is deposited conformally within the trenches 214 including along sidewalls of the cladding layer 222 and along a top surface of the STI features 220. Thereafter, a dielectric layer 226 is deposited over the dielectric layer 224. In at least some embodiments, the dielectric layers 224 and 226 may collectively define a dielectric fin (or hybrid fin) 228. In some cases, a dielectric fin 228 may further include a high-k dielectric layer formed over the dielectric layers 224 and 226, for example after recessing of the dielectric layers 224 and 226, as discussed below. Generally, and in some embodiments, the dielectric layers 224 and 226 may include SiN, SiCN, SiOC, SiOCN, SiOx, or other appropriate material. In some examples, the dielectric layer 224 may include a low-k dielectric layer, and the dielectric layer 226 may include a flowable oxide layer. In various cases, the dielectric layers 224 and 226 may be deposited by a CVD process, an ALD process, a PVD process, a spin-coating and baking process, and/or other suitable process. In some examples, after depositing the dielectric layers 224 and 226, a CMP process may be performed to remove excess material portions and to planarize a top surface of the device 200.

The method 100 at operation 110 may further include a recessing process, a high-k dielectric layer deposition process, and a CMP process. Still referring to FIGS. 6A and 6B, in an embodiment of operation 110, a recessing process is performed to remove top portions of the dielectric layers 224 and 226. In some embodiments, the recessing process may include a dry etching process, a wet etching process, and/or a combination thereof. In some embodiments, a recessed depth is controlled (e.g., by controlling an etching time) to result in a desired recessed depth. In some embodiments, the recessing process may optionally remove at least part of the cladding layer 222. After performing the recessing process, and in a further embodiment of operation 110, a high-k dielectric layer 230 is deposited within trenches formed by the recessing process. In some embodiments, the high-k dielectric layer 230 may include $HfO_2$, $ZrO_2$, HfAlOx, HfSiOx, $Y_2O_3$, $Al_2O_3$, or another high-k material. The high-k dielectric layer 230 may be deposited by a CVD process, an ALD process, a PVD process, and/or other suitable process. After deposition of the high-k dielectric layer 230, and in a further embodiment of operation 110, a CMP process is performed to remove excess material portions and to planarize a top surface of the device 200. In some examples, the CMP process removes a portion of the cladding layer 222 from the top of the semiconductor fins 210 to expose the HM layer 212. Thus, in various cases, a dielectric fin 228 is defined as having a lower portion including the recessed portions of the dielectric layers 224, 226 and an upper portion including the high-k dielectric layer 230. In some examples, a height of the high-k dielectric layer 230 may be about 20 nm to about 30 nm with a width ranging from about 15 nm to about 25 nm. In some cases, a dielectric fin 228 may be alternatively described as a bi-layer dielectric having a high-k upper portion and a low-k lower portion. In some examples, a height ratio of the upper portion to the lower portion may be about 1:20 to about 20:1. The height ratio may be adjusted, for example, by changing the recess depth and thus the height of the high-K dielectric layer 230, as noted above. As will be discussed in more detail below, the dielectric fins 228 are used to effectively prevent the lateral merging of S/D epitaxial features formed between adjacent semiconductor fins 210. During the epitaxial growth, S/D epitaxial features laterally expand between opposing sidewalls of the dielectric fins 228 and at least partially fill the spacing between adjacent dielectric fins 228.

Figures 7A, 7B:
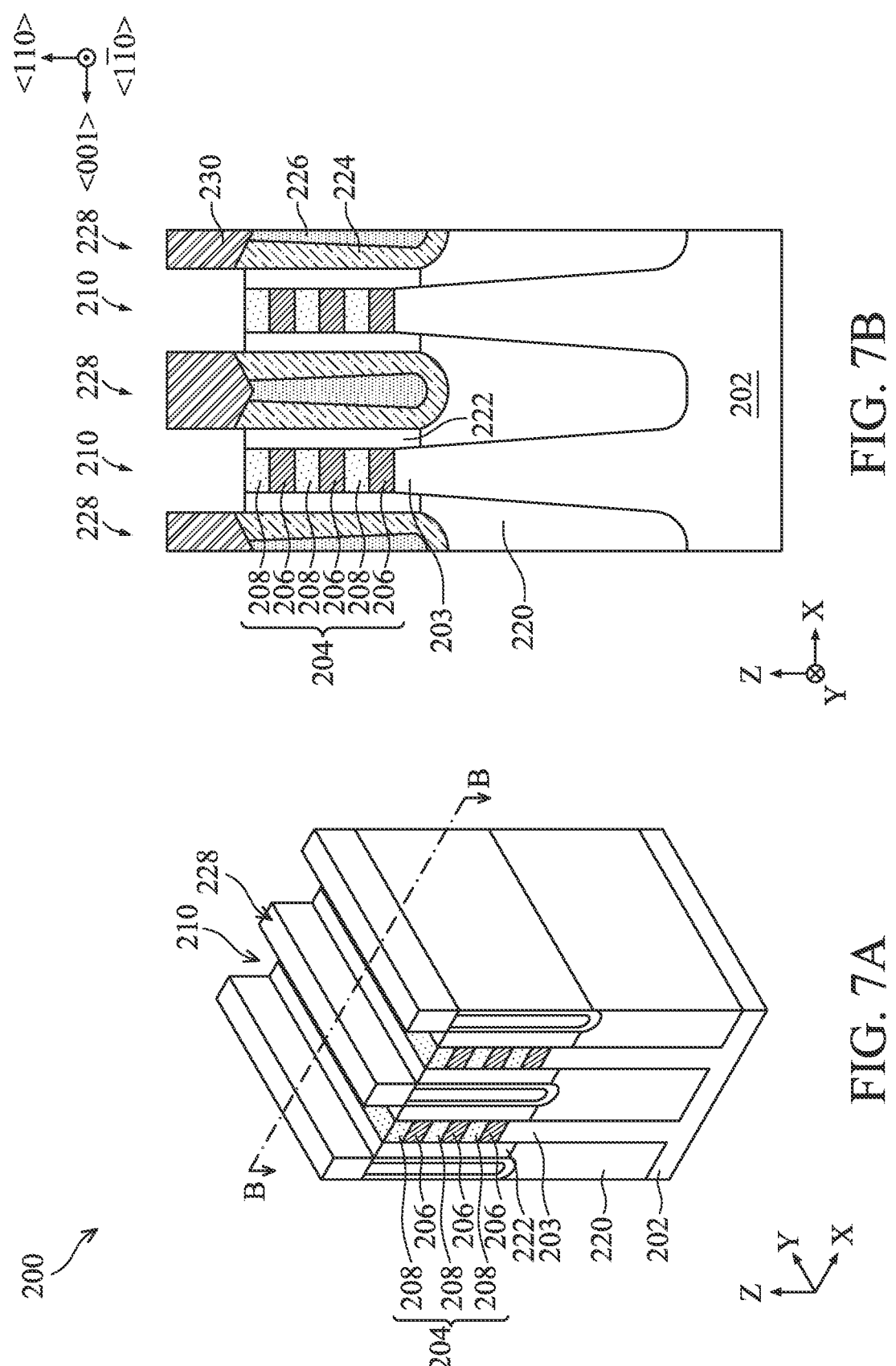

At operation 112, the method 100 (FIG. 1) removes the HM layer 212 and a top portion of the cladding layer 222. Referring to FIGS. 7A and 7B, in an embodiment of operation 112, the HM layer 212 and a top portion of the cladding layer 222 may initially be etched-back. The topmost epitaxial layer 206 may act as an etch stop layer for etching the HM layer 212 and be subsequently removed. The top portion of the cladding layer 222 may be removed together with the topmost epitaxial layer 206 by the same etchant that targets the same semiconductor material, such as SiGe. In some embodiments, a top surface of the etched-back cladding layer 222 is substantially level with top surfaces of the topmost epitaxial layer 208 of the semiconductor fins 210. In some embodiments, the etch-back of the HM layer 212 and the top portion of the cladding layer 222 may be performed using a wet etch process, a dry etch process, a multiple-step etch process, and/or a combination thereof. The HM layer 212 may be removed, for example, by a wet etching process using $H_3PO_4$ or other suitable etchants.

Figures 8A, 8B:
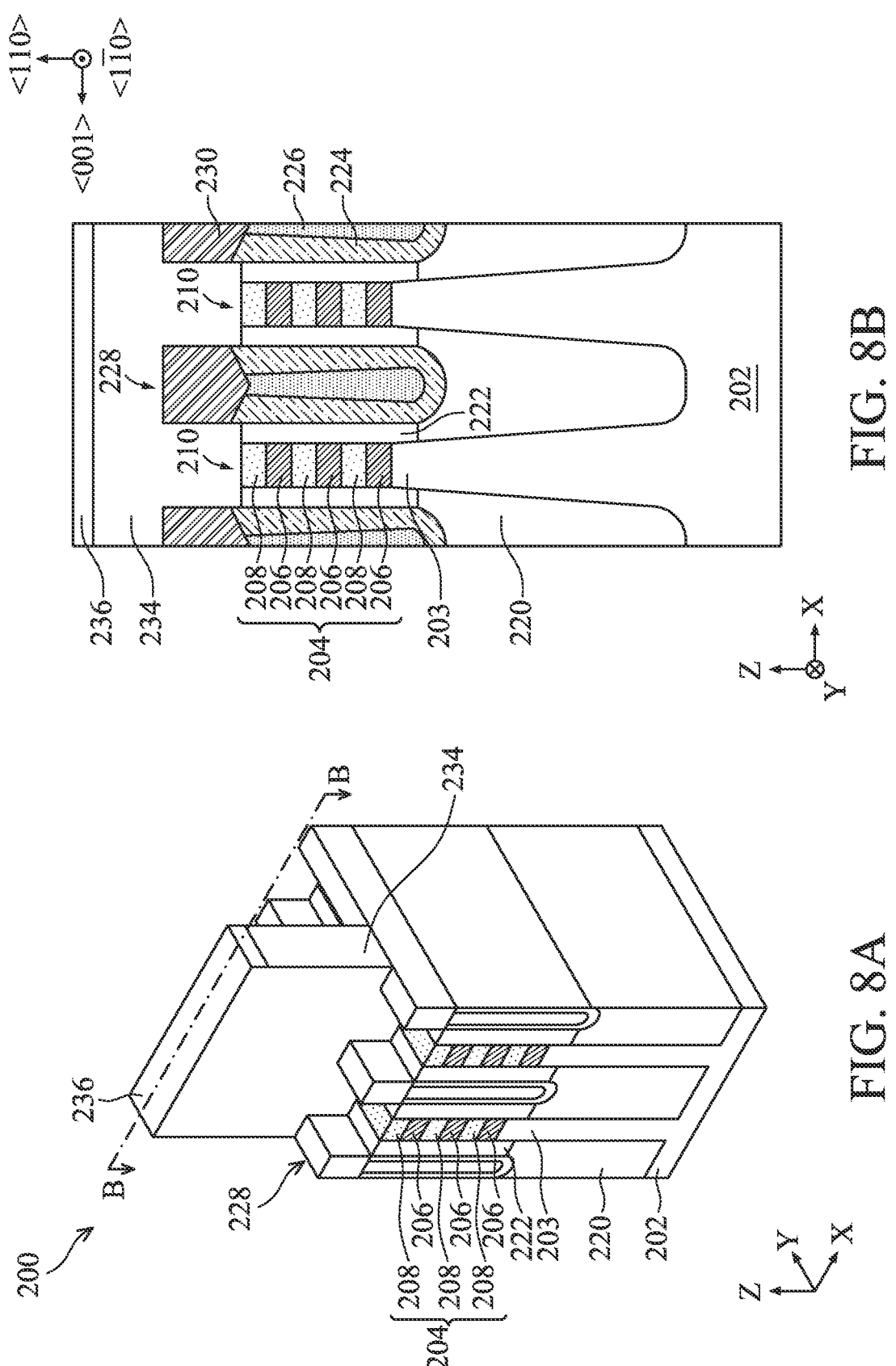
Figures 9A, 9B:
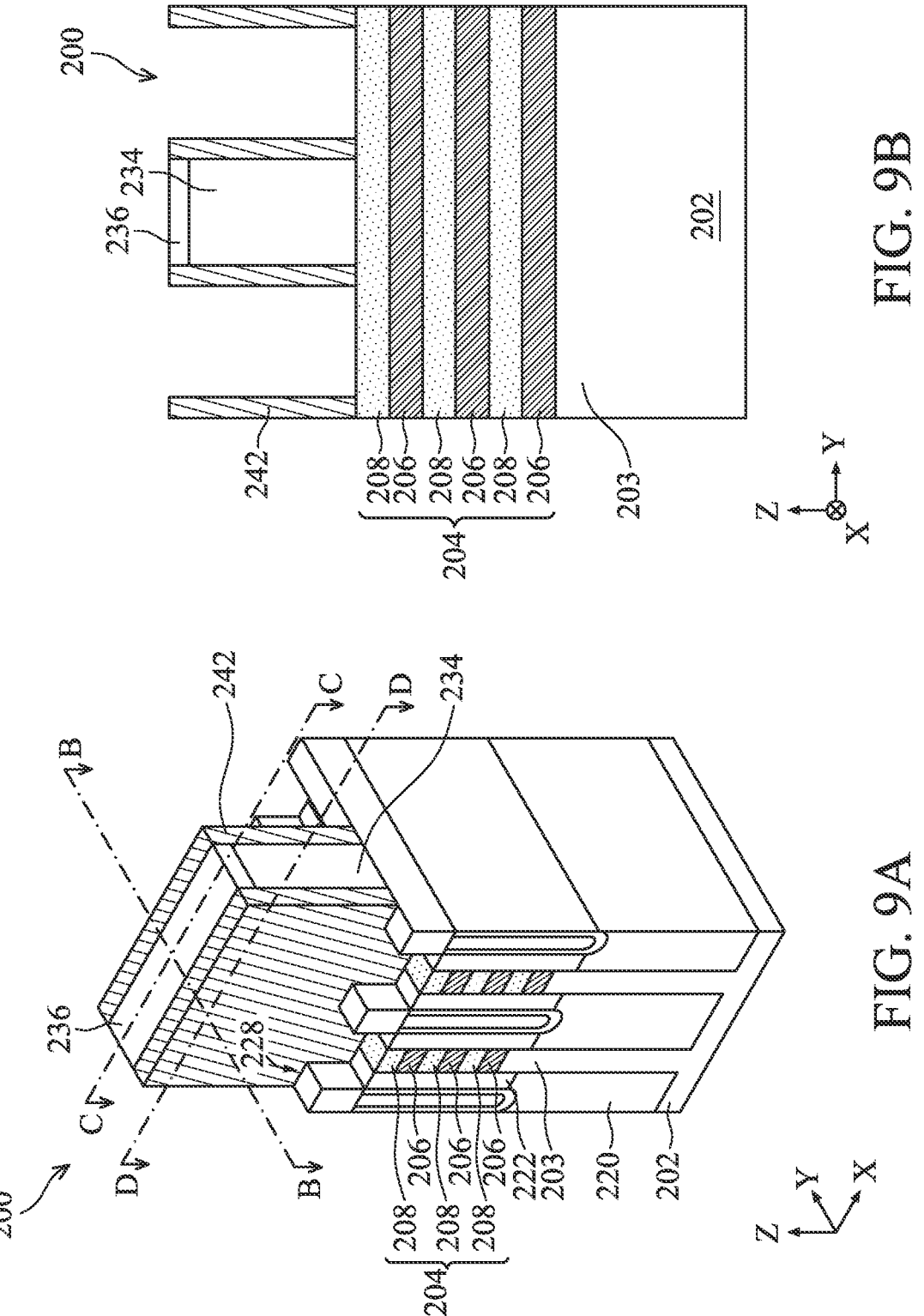
Figures 9C, 9D:
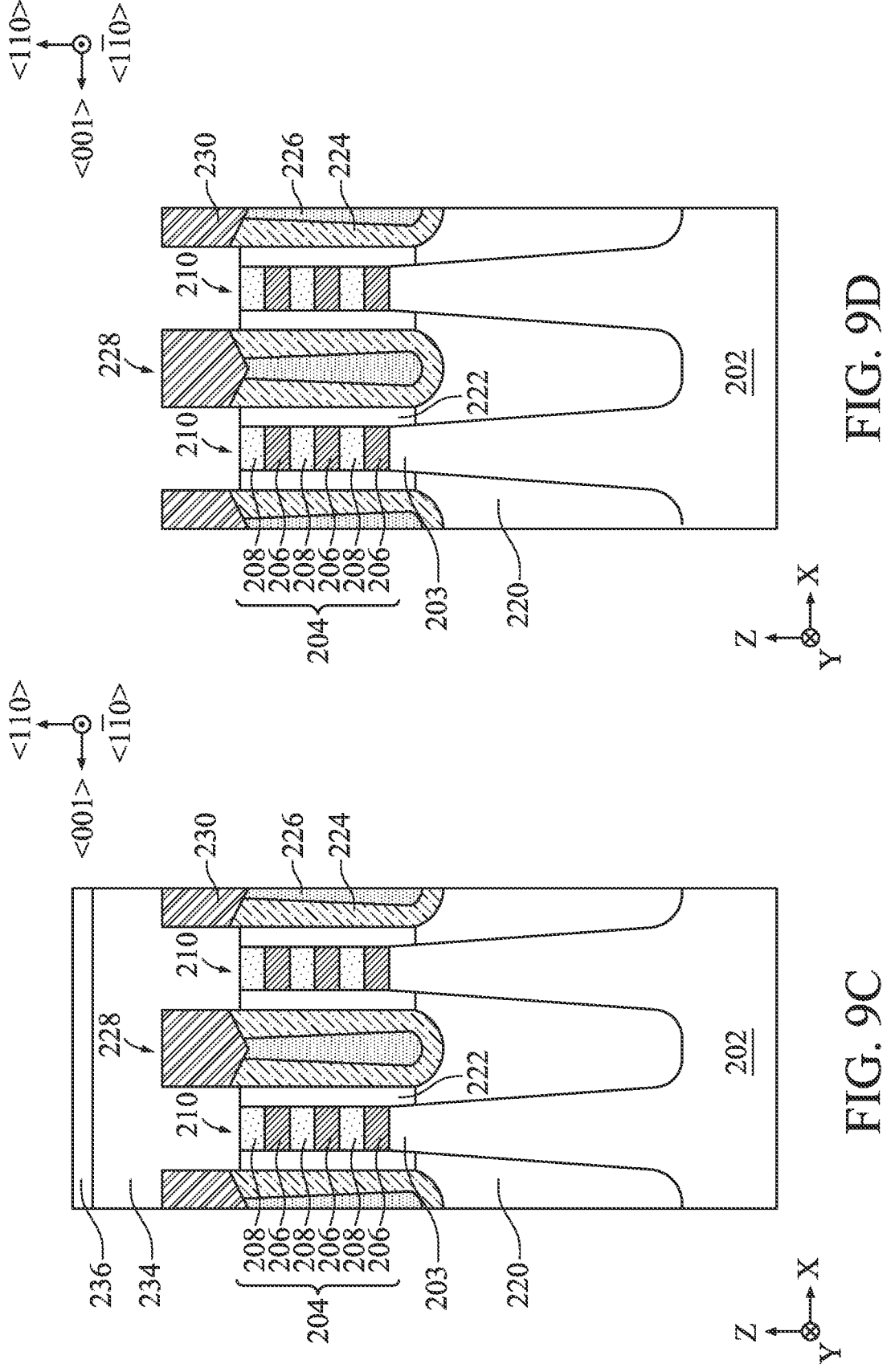

The method 100 then proceeds to operation 114 (FIG. 1) where a dummy gate structure is formed. While the present discussion is directed to a replacement gate (or gate-last) process whereby a dummy gate structure is formed and subsequently replaced, other configurations may be possible. With reference to FIGS. 8A and 8B, a dummy gate structure 234 is formed. The dummy gate structure 234 will be replaced by a final gate stack at a subsequent processing stage of the device 200. In particular, the dummy gate structure 234 may be replaced at a later processing stage by a high-k dielectric layer (HK) and metal gate electrode (MG), as will be discussed in more detail below. In some embodiments, the dummy gate structure 234 is disposed over the semiconductor fins 210, the cladding layer 222, and the dielectric fins 228. The portion of the semiconductor fins 210 underlying the dummy gate structure 234 may be referred to as the channel region. The dummy gate structure 234 may also define source/drain (S/D) regions of the semiconductor fins 210, for example, the regions of the semiconductor fin 210 adjacent and on opposing sides of the channel region.

In some embodiments, the dummy gate structure 234 is formed by various process steps such as layer deposition, patterning, etching, as well as other suitable processing steps. Exemplary layer deposition processes include CVD (including low-pressure CVD, plasma-enhanced CVD, and/or flowable CVD), PVD, ALD, thermal oxidation, e-beam evaporation, or other suitable deposition techniques, or combinations thereof. In some embodiments, the dummy gate structure 234 includes a dummy dielectric layer and a dummy electrode layer. In some embodiments, the dummy dielectric layer may include $SiO_2$, silicon nitride, a high-k dielectric material and/or other suitable material. Subsequently, the dummy electrode layer is deposited. In some embodiments, the dummy electrode layer may include polycrystalline silicon (polysilicon). In forming the dummy gate structure for example, the patterning process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. In some embodiments, the dummy gate structure 234 is patterned through a hard mask 236. The hard mask 236 may include multiple layers, such as an oxide layer and a nitride layer over the oxide layer. In some embodiments, after formation of the dummy gate structure 234, the dummy dielectric layer is removed from the S/D regions of the semiconductor fins 210. The etch process may include a wet etch, a dry etch, and/or a combination thereof. The etch process is chosen to selectively etch the dummy dielectric layer without substantially etching the semiconductor fins 210, the hard mask 236, and the dummy electrode layer.

At operation 116, the method 100 (FIG. 1) forms gate spacers on sidewall surfaces of the dummy gate structure 234. With reference to FIGS. 9A-9D, gate spacers 242 are formed. The gate spacers 242 may have a thickness from about 2 nm to about 10 nm. In some examples, the gate spacers 242 may include a dielectric material such as silicon oxide, silicon nitride, silicon carbide, silicon oxynitride, SiCN, silicon oxycarbide, SiOCN, a low-k material, and/or combinations thereof. In some embodiments, the gate spacers 242 include multiple layers, such as a liner spacer layer and a main spacer layer, and the like. By way of example, the gate spacers 242 may be formed by conformally depositing a dielectric material over the device 200 using processes such as a CVD process, a subatmospheric CVD (SACVD) process, a flowable CVD process, an ALD process, a PVD process, or other suitable process. Following the conformal deposition of the dielectric material, portions of the dielectric material used to form the gate spacers 242 may be etched-back to expose portions of the semiconductor fins 210 not covered by the dummy gate structures 234 (e.g., in source/drain regions). In some cases, the etch-back process removes portions of dielectric material used to form the gate spacers 242 along a top surface of the dummy gate structure 234, thereby exposing the hard mask layer 236. In some embodiments, the etch-back process may include a wet etch process, a dry etch process, a multiple-step etch process, and/or a combination thereof. It is noted that after the etch-back process, the gate spacers 242 remain disposed on sidewall surfaces of the dummy gate structure 234.

At operation 118, the method 100 (FIG. 1) recesses the semiconductor fins 210 in the S/D regions in forming S/D recesses. With reference to FIGS. 10A-10D, a source/drain etch process is performed to form the S/D recesses 246 by removing portions of the semiconductor fins 210 and the cladding layer 222 not covered by the dummy gate structure 234 (e.g., in source/drain regions). In particular, the source/drain etch process may serve to remove the exposed epitaxial layer portions 206 and 208 in source/drain regions of the device 200 to expose the mesa 203 of the semiconductor fins 210. In some embodiments, the source/drain etch process may include a dry etching process, a wet etching process, and/or a combination thereof. In some embodiments, a recessed depth is controlled (e.g., by controlling an etching time) such that the top surface $S_{203}$ of the mesa 203 is recessed to be under the top surface of the STI features 220. FIG. 10D is overlayed with the remaining portions of the epitaxial stack 204 and the mesa 203 in the channel region for better illustration, which are represented by dotted shapes. The epitaxial stack 204 has a thickness T1. The mesa 203 above the recessed top surface $S_{203}$ has a thickness T2. In some embodiments, the thickness T1 ranges from about 30 nm to about 80 nm, and the thickness T2 ranges from about 15 nm to about 60 nm. In various embodiments, T1 is larger than T2, and T1-T2 ranges from about 0 nm to about 30 nm. The range of T1-T2 is not trivial. If T1-T2 is more than about 30 nm, the manufacturing cost would be unnecessary increased; if T1-T2 is less than about 0 nm, device performance would decline due to less available channel layer height.

Still referring to FIG. 10D, due to limited etch selectivity, the dielectric layer 224 of the dielectric fin 228 may have etch loss, such that sidewalls of the dielectric fin 228 may have a taper profile under the high-k dielectric layer 230. In the illustrated embodiment as in FIG. 10D, the dielectric fin 228 is trimmed by the source/drain etch process, such that a bottom surface of the high-k dielectric layer 230 is exposed. Also, the STI features 220 may also be partially etched due to limited etch selectivity during the source/drain etch process. A width of the top portion of the STI feature 220 may be trimmed to be narrower than a width of the bottom portion of the dielectric fin 228. Notches (or referred to as dips) may be formed on the sidewalls of the STI feature 220. The tips of the notches are denoted as P1 and P2. In some embodiments, the tips P1 and P2 are directly under the dielectric layer 224. In furtherance of some embodiments, the tips P1 and P2 are directly under the dielectric layer 226. The lateral distance from P1 to P2 measured along the X-axis represents the widest opening at the bottom portion of the S/D recess 246.

Figures 10A, 10B:
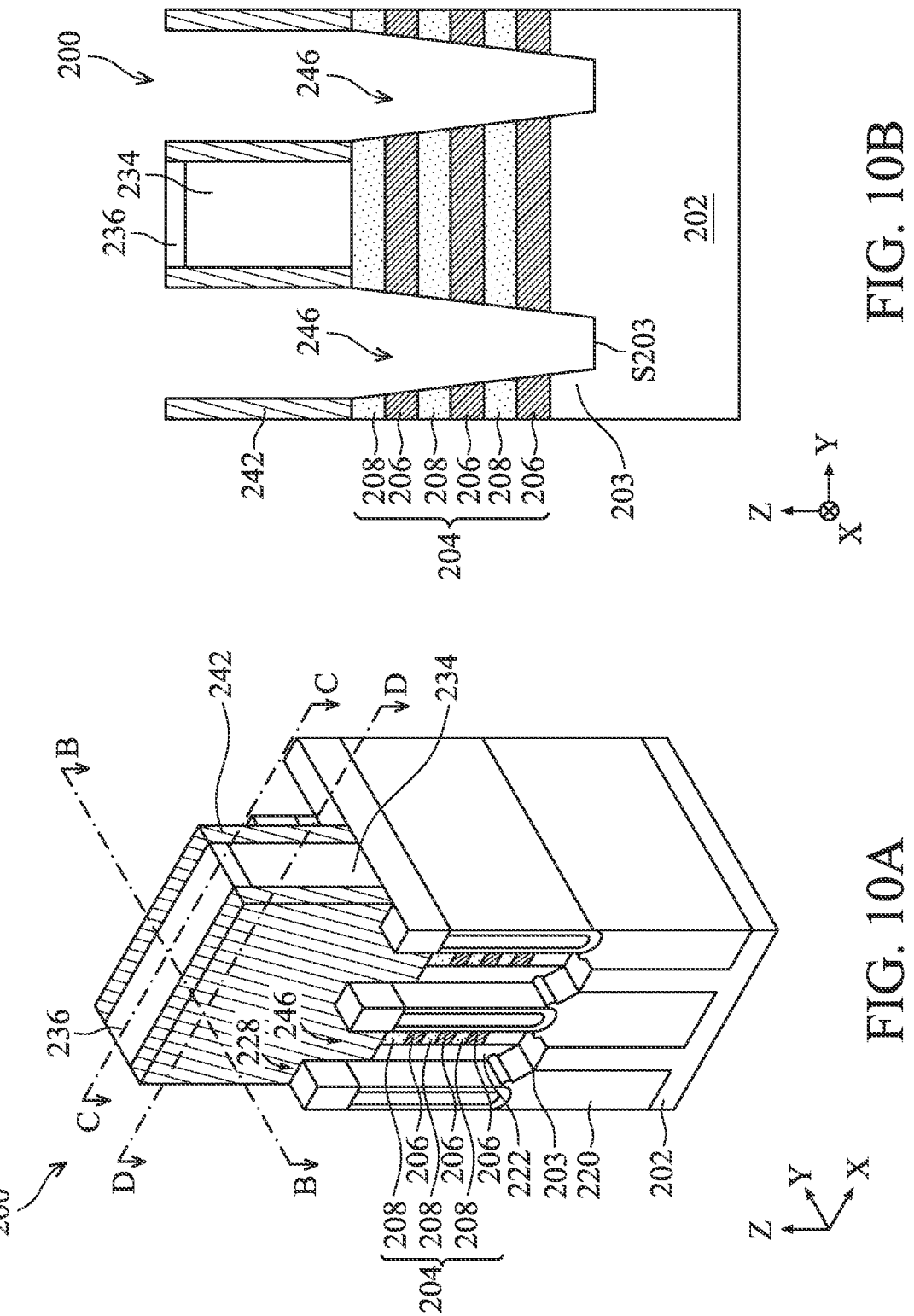
Figures 10C, 10D:
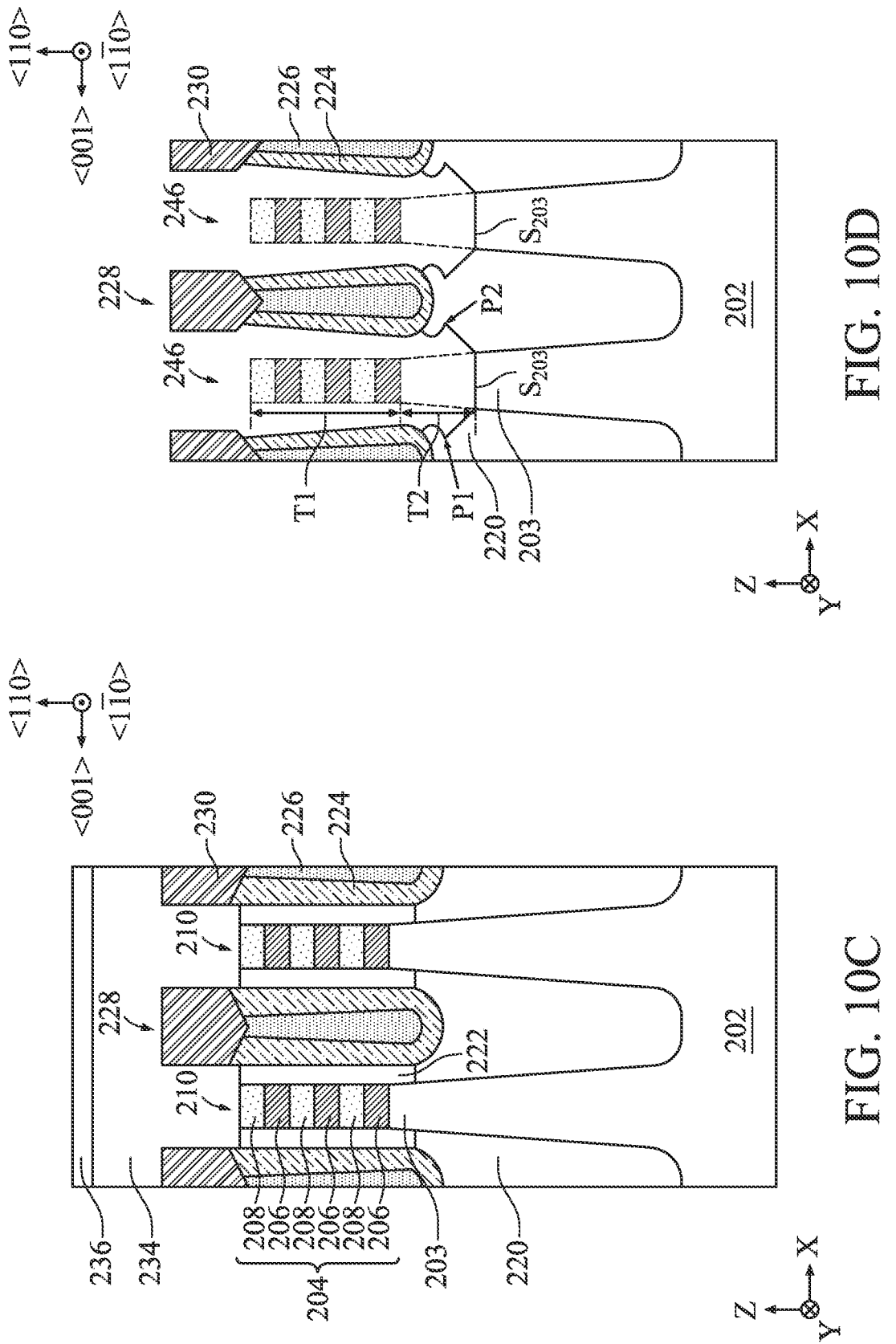

Referring to FIG. 10B, due to the loading effect during the source/drain etch process, sidewalls of the S/D recesses 246 may have a tapered profile, such that the S/D recesses 246 are narrower in the bottom portion and wider in the top portion, and consequently the semiconductor fin 210 between two adjacent S/D recesses 246 is wider in the bottom portion and narrower in the top portion.

Figures 11A, 11B:
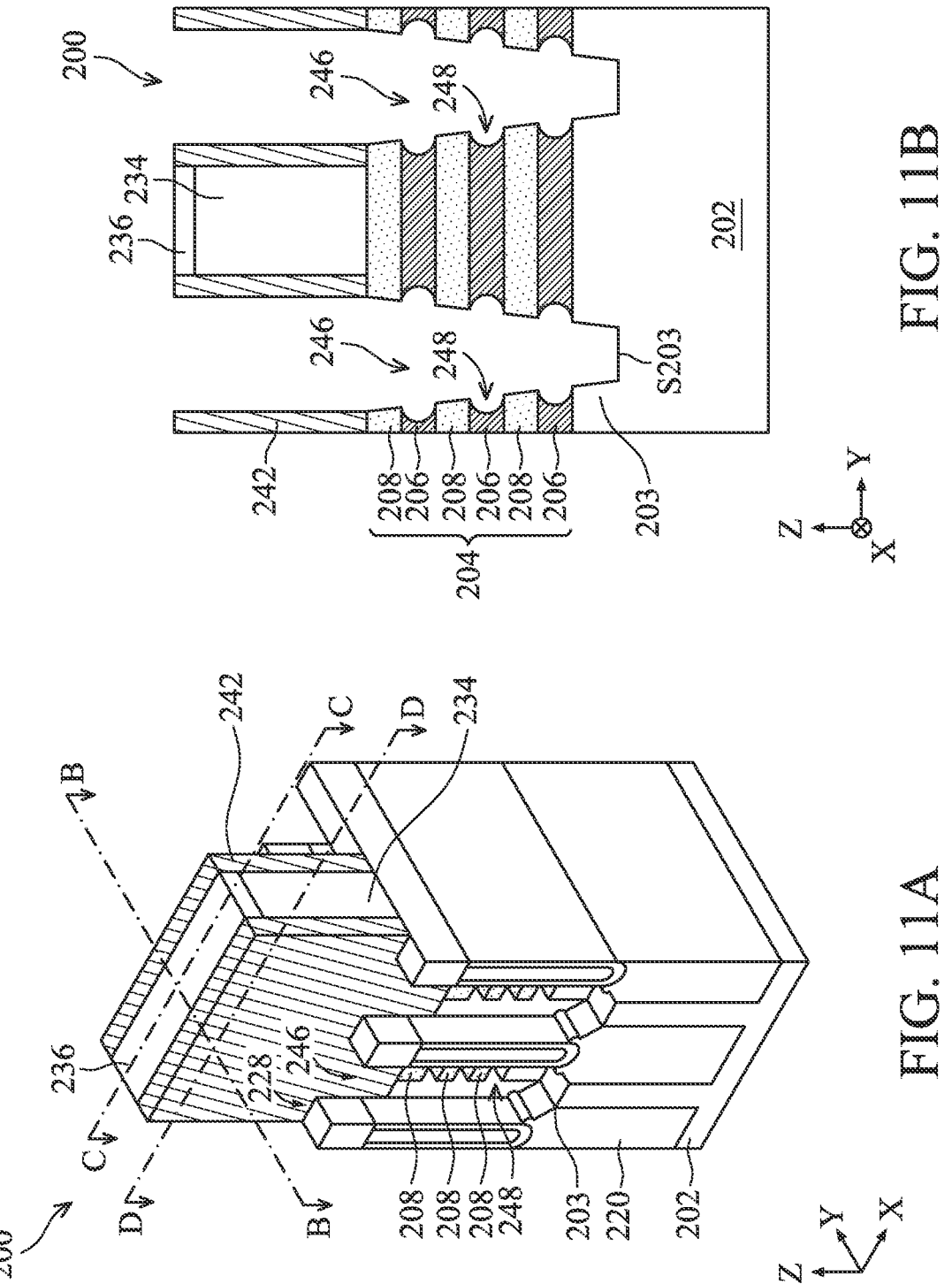
Figures 11C, 11D:
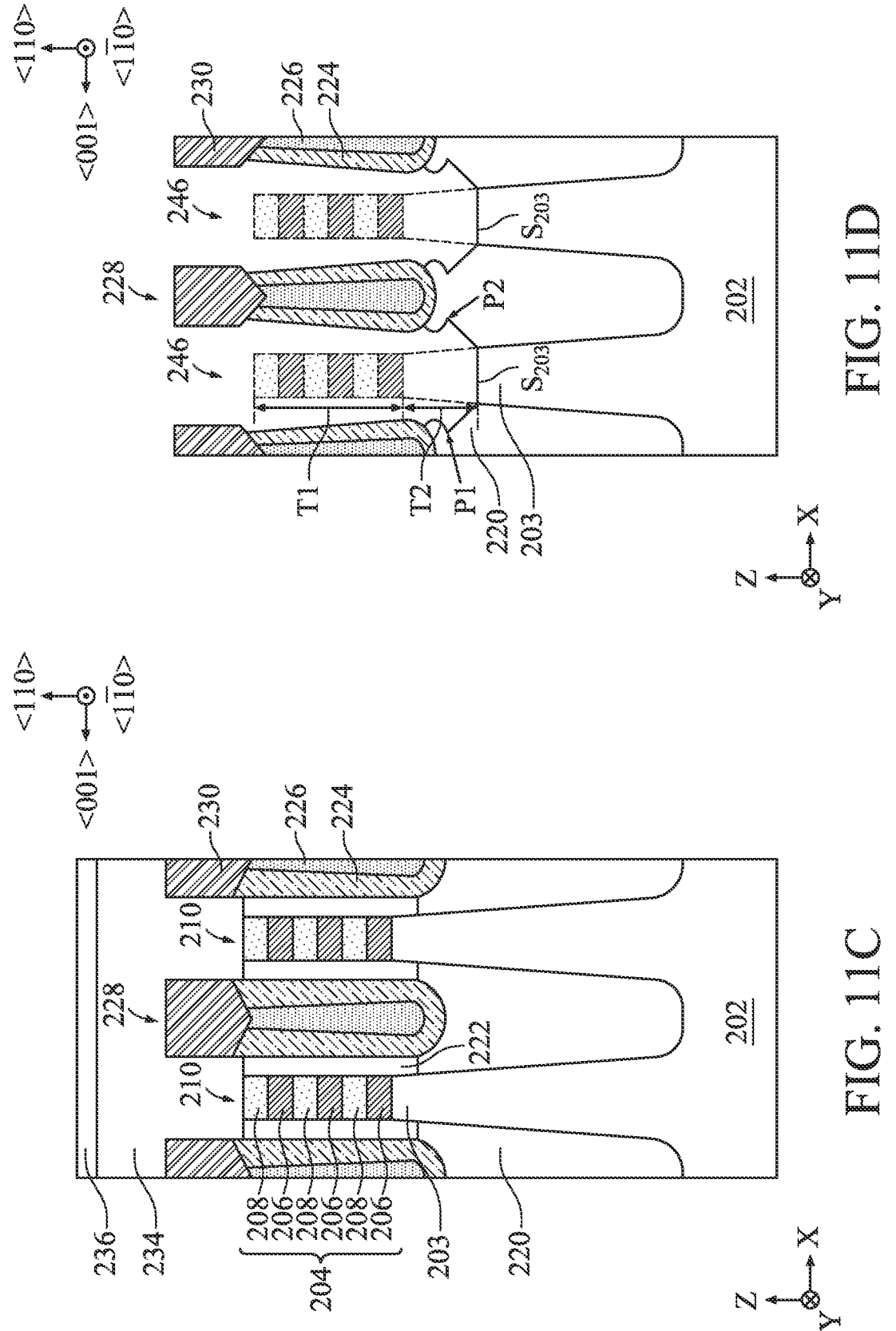
Figures 12A, 12B:
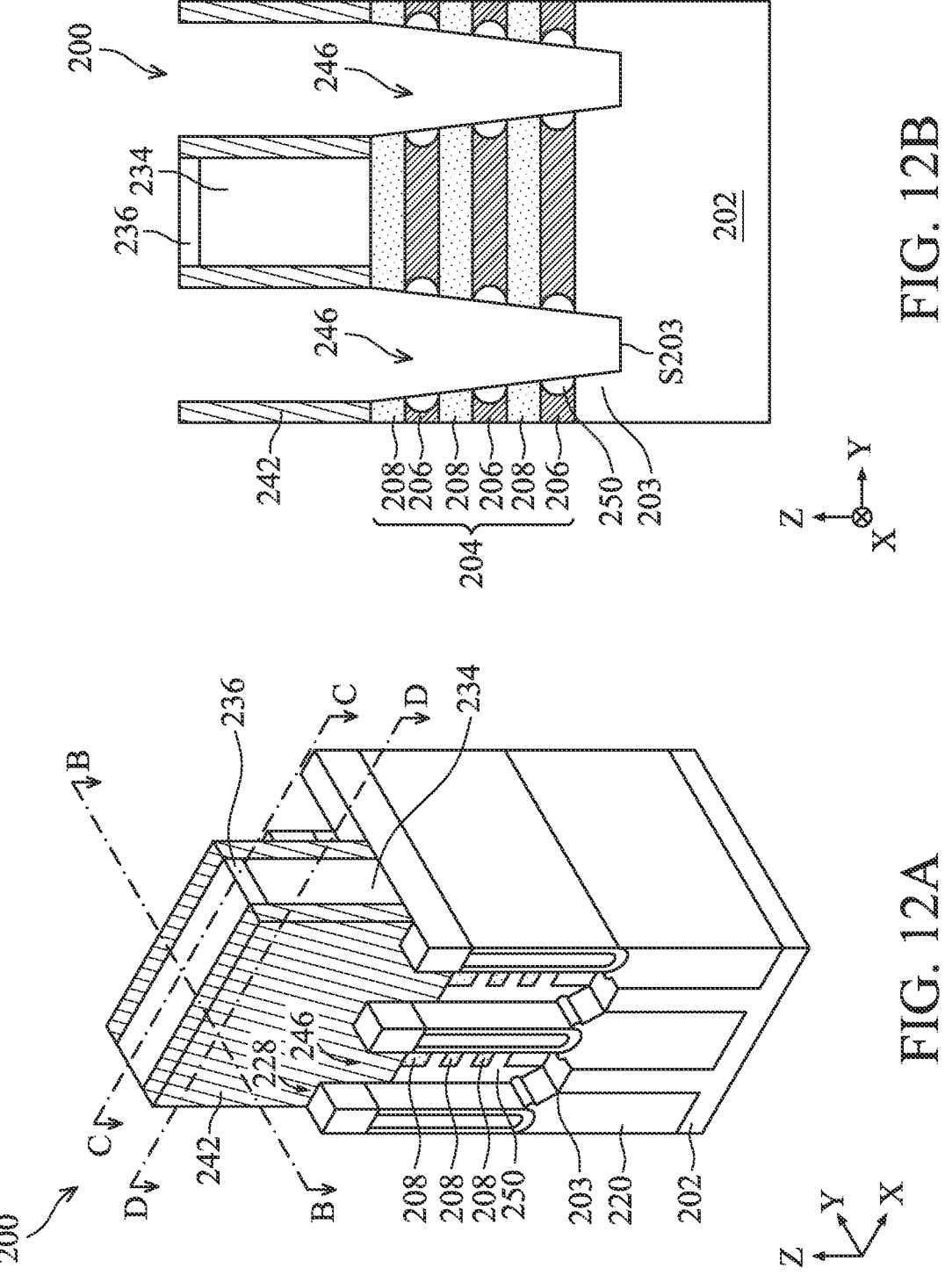
Figures 12C, 12D:
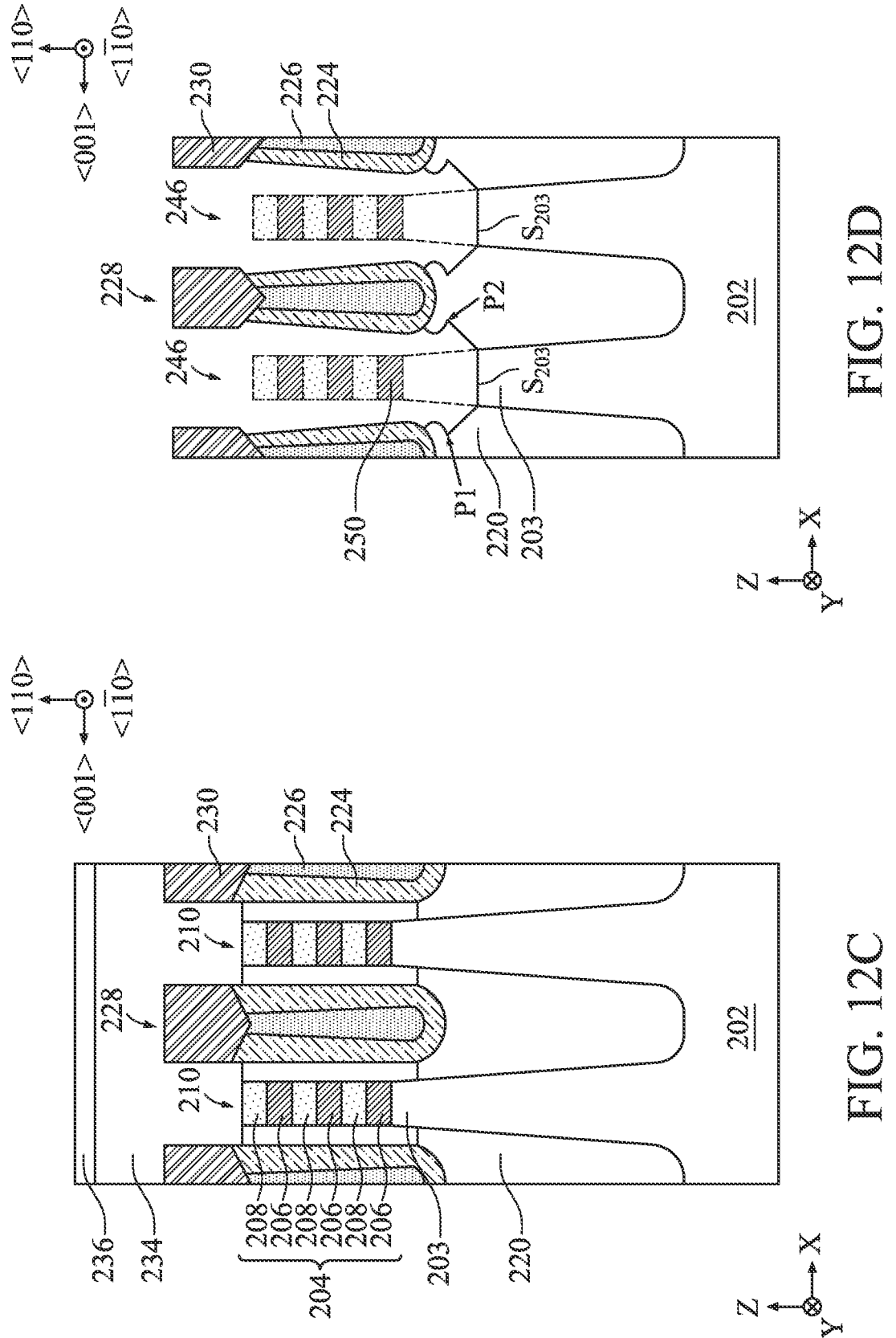

At operation 120, the method 100 (FIG. 1) forms inner spacer cavities. With reference to FIGS. 11A-11D, by laterally recessing the epitaxial layers 206 through S/D recesses 246, inner spacer cavities 248 are formed. In some embodiments of operation 120, a lateral etching (or horizontal recessing) is performed to recess the epitaxial layers 206 to form inner spacer cavities 248. The amount of etching of the epitaxial layers 206 is in a range from about 2 nm to about 10 nm in some embodiments. The lateral etching also recesses the cladding layer 222 in the Y-direction (FIG. 11A). When the epitaxial layers 206 and the cladding layer 222 are SiGe, the lateral etching process may use an etchant selected from, but not limited to, ammonium hydroxide ($NH_4OH$), tetramethylammonium hydroxide (TMAH), ethylenediamine pyrocatechol (EDP), and potassium hydroxide (KOH) solutions. In some embodiments, recessed sidewalls of the cladding layer 222 are substantially flush with the sidewall surfaces of the dummy gate structure 234. Here, "being substantially flush" means the difference in the relative position is less than about 1 nm.

At operation 122, the method 100 (FIG. 1) forms inner spacers. With reference to FIGS. 12A-12D, inner spacers 250 are formed in the inner spacer cavities 248. A length of the inner spacers 250 (along the Y-direction) may range from about 3 nm to about 8 nm, in some embodiments. In some embodiments of operation 122, an insulating layer is formed on the lateral ends of the epitaxial layers 206 to fill the inner spacer cavities 248, thereby forming inner spacers 250. The insulating layer may include a dielectric material, such as SiN, SiOC, SiOCN, SiCN, SiO2, and/or other suitable material. In some embodiments, the insulating layer is conformally deposited in the S/D recesses 246, for example, by ALD or any other suitable method. After the conformal deposition of the insulating layer, an etch-back process is performed to partially remove the insulating layer from outside of the inner spacer cavities 248. By this etching the insulating layer remains substantially within the inner spacer cavities 248. In some examples, the etch-back process may also etch a portion of the high-k dielectric layer 230 of the dielectric fins 228 not covered by the dummy gate structure 234. The locations of the inner spacers 250 are also overlayed in FIG. 12D for better illustration.

At operation 124, the method 100 (FIG. 1) forms a buffer semiconductor region at the bottom of the S/D recesses 246. With references to FIGS. 13A-13D, a buffer semiconductor region 254 is epitaxially grown from the recessed top surface $S_{203}$ of the mesa 203. By way of example, epitaxial growth of the buffer semiconductor region 254 may be performed by vapor-phase epitaxy (VPE), ultra-high vacuum CVD (UHV-CVD), molecular beam epitaxy (MBE), and/or other suitable processes. In some embodiments, the buffer semiconductor region 254 include the same material as the substrate 202, such as silicon (Si). The buffer semiconductor region 254 may also be referred to as buffer silicon region 254 or buffer epitaxial layer 254. In some alternative embodiments, the buffer semiconductor region 254 includes a different semiconductor material than the substrate 202, such as silicon germanium (SiGe). In some embodiments, the buffer semiconductor region 254 is dopant-free, where for example, no intentional doping is performed during the epitaxial growth process. Alternatively, the buffer semiconductor region 254 may be slightly doped with dopants such as Ge or Sn. As a comparison, in one instance, the substrate 202 is lightly doped and has a higher doping concentration than the buffer semiconductor region 254. The buffer semiconductor region 254 provides a high resistance path from the to-be-formed S/D epitaxial features to the semiconductor substrate, such that the leakage current in the semiconductor substrate (i.e., through mesa 203) is suppressed.

Figures 13A, 13B:
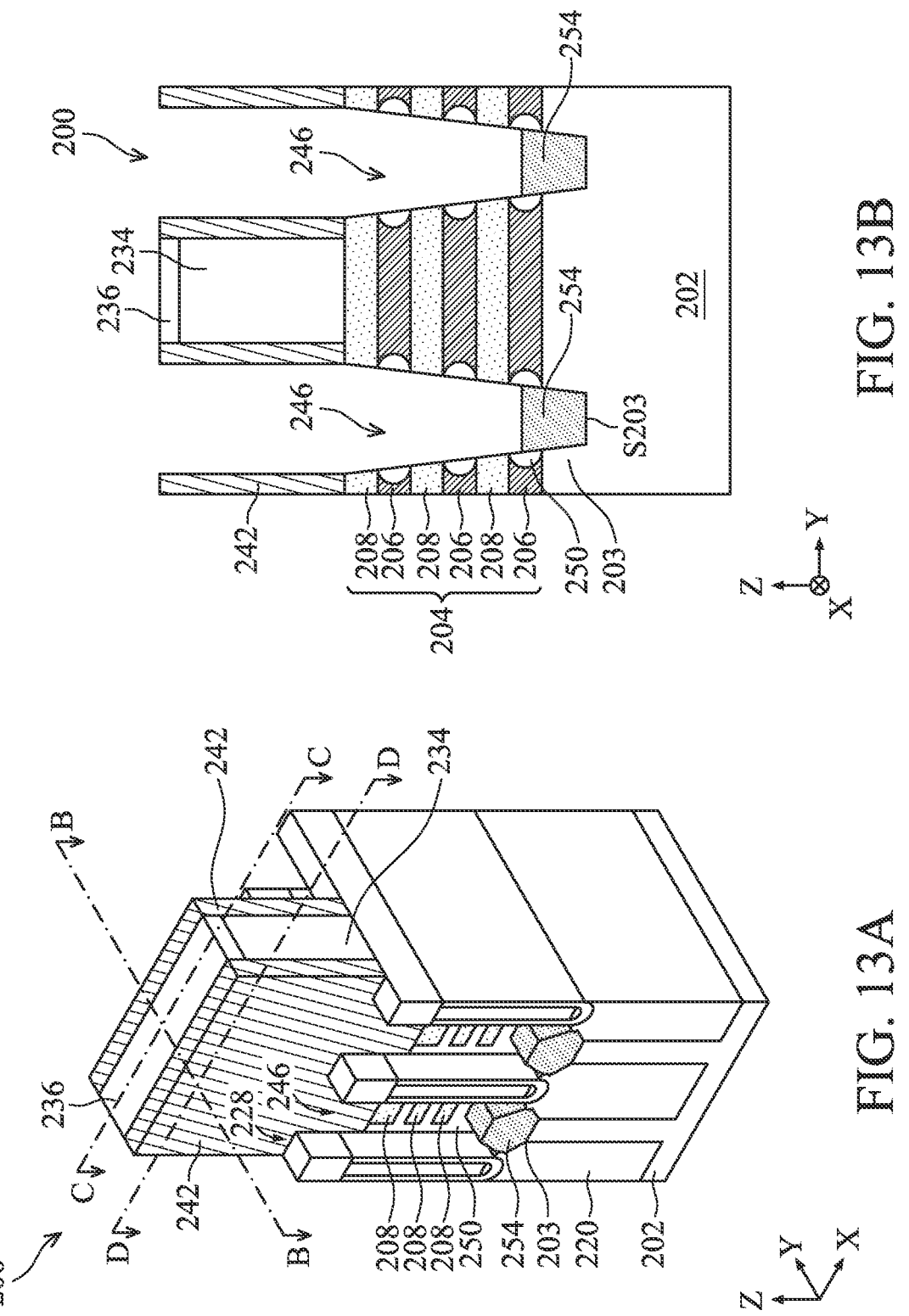

The dielectric materials of the dielectric fins 228 and the inner spacers 250 limit the epitaxial growth of the buffer semiconductor region 254 from the bottom of the S/D recesses 246. The growth of the buffer semiconductor region 254 is under time control such that the top surface of the buffer semiconductor region 254 is above a top surface of the mesa 203 in the channel region and also partially overlaps with a bottommost inner spacer 250 (FIG. 13B). The bottommost inner spacer 250 is interposed between the buffer semiconductor region 254 and the bottommost epitaxial layer 206. The buffer semiconductor region 254 is in physical contact with a lower portion of the bottommost inner spacer 250.

Figures 13C, 13D:
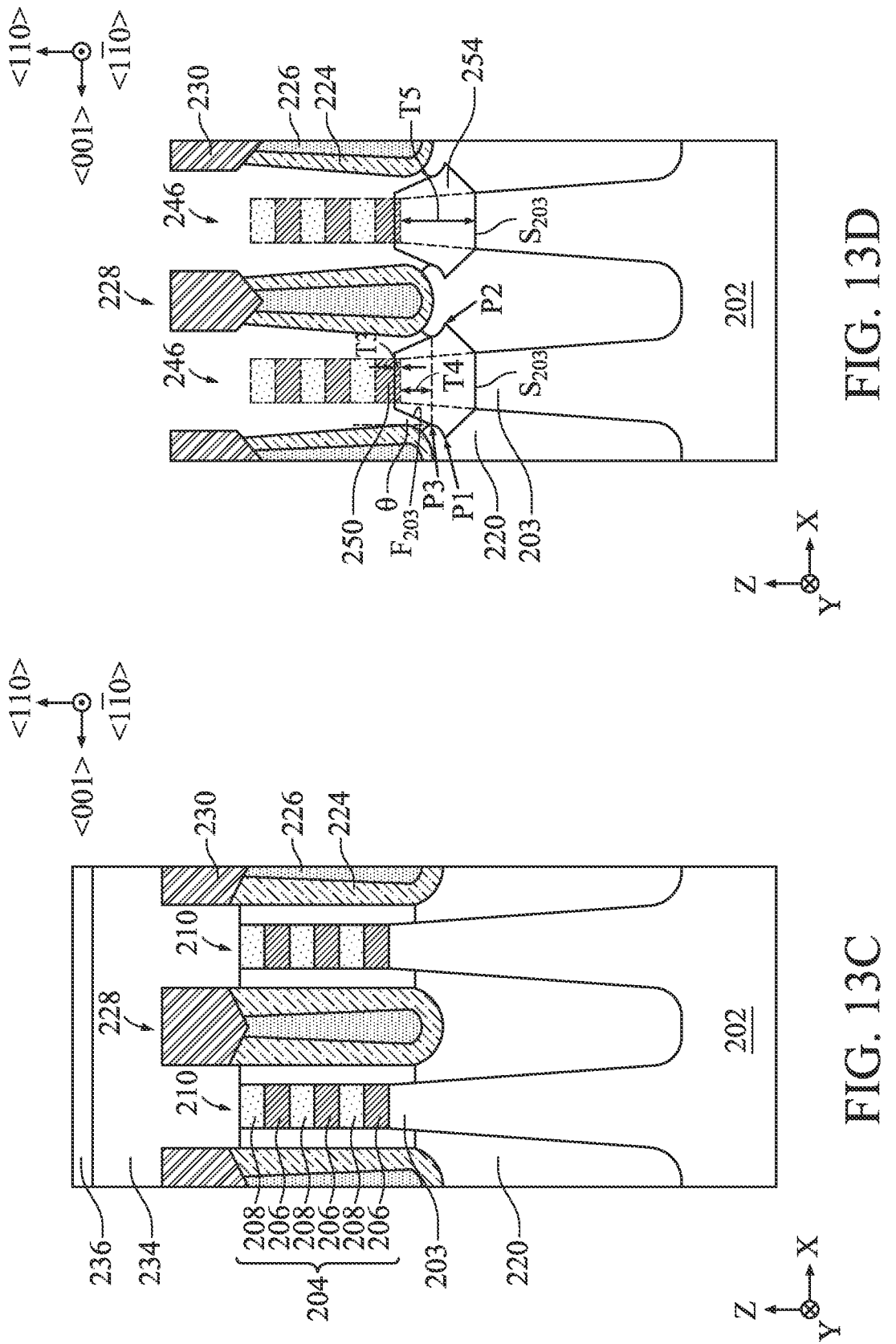

Referring to FIG. 13D, which is overlayed with the epitaxial stack 204 and the mesa 203 in the channel region, the vertical sidewall (in X-Z plane) of the mesa 203 in the channel region (as exposed in the S/D recesses 246) is in physical contact with and fully covered by the buffer semiconductor region 254. The buffer semiconductor region 254 protects the mesa 203 in the channel region from dopant diffusion when the S/D epitaxial features are subsequently formed in the S/D recesses 246. The substantially undoped mesa 203 remains as a high resistance path in suppressing substrate leakage.

Still referring to FIG. 13D, the buffer semiconductor region 254 exhibits faceted growth when it raises above the recessed top surface $S_{203}$ of the mesa 203. Since the substrate 202 is a (110) substrate, the buffer semiconductor region 254 is accordingly a crystalline semiconductor layer with a top surface in a (110) crystal plane. The facet $F_{203}$ is in a (111) crystal plane. An optional post hydrochloric acid cleaning process after the epitaxial growing of the buffer semiconductor region 254 also shapes the facet $F_{203}$. In the illustrated embodiment, the facet $F_{203}$ intersects the sidewall of the STI feature 220 at a point P3 which is above the tips P1 and P2. In some embodiments, the point P3 is directly under the dielectric layer 224 of the dielectric fin 228. The facet $F_{203}$ extends from the point P3, and the buffer semiconductor region 254 is free of contact with the dielectric fin 228. In some alternative embodiments, the facet $F_{203}$ intersects the sidewall of the dielectric fin 228, and the buffer semiconductor region 254 is in physical contact with the dielectric fin 228.

Generally, a (100) substrate is used in semiconductor manufacturing. The epitaxial growth rate in a <100> direction may be two to four times faster than in <111> direction. Epitaxially growing from a (100) substrate, the facet $F_{203}$ often forms an angle θ with respect to a normal direction that is larger than 54.7°. Consequently, the height of the buffer semiconductor region 254 rises too fast, such that the bottommost channel layer 208 is already overlapped with the buffer semiconductor region 254 before the buffer semiconductor region 254 fully expands between the spacing between tips P1 and P2. The overlapping with the bottommost channel layer 208 reduces effective channel height of the transistor and reduces current driving capability of the device. On the other hand, if the height of the buffer semiconductor region 254 is controlled under the bottommost channel layer 208, the spacing between the STI features 220 may not be filled up, which may cause dopant diffusion into the mesa 203.

As a comparison, epitaxially growing from a (110) substrate, the epitaxial growth rate mismatch between <110> and <111> directions is much lower than between <100> and <111> directions, allowing the buffer semiconductor region 254 to fully expand between the spacing between tips P1 and P2 before the top surface of the buffer semiconductor region 254 raises too fast above the top surface of the bottommost inner spacer 250. In other words, when the bottom portion of the S/D recesses 246 is fully occupied by the buffer semiconductor region 254, the bottommost channel layer 208 is still above and free of contact with the top surface of the buffer semiconductor region 254. In various embodiments, the angle θ ranges from about 5° to about 35.5°. This range is not trivial. If the angle θ is larger than about 35.5°, the resulting buffer semiconductor region 254 may not sufficiently protects the mesa 203 from dopant diffusion; if the angle θ is less than about 5°, the facet is nearly an ideal surface and hard to maintain during manufacturing process.

In some embodiments, the buffer semiconductor region 254 overlaps with the bottommost inner spacer 250 (bottommost epitaxial layer 206) for a thickness T3 (measured in Z-axis) from about 1 nm to about 5 nm; a distance T4 from the point P3 of the facet $F_{203}$ to the bottom surface of the epitaxial stack 204 (the bottom surface of the bottommost epitaxial layer 206) ranges from about 0 nm to about 5 nm; the buffer semiconductor region 254 has a thickness T5 (measured in Z-axis) from about 10 nm to about 50 nm. These ranges are not trivial. If the thickness T3 is less than about 1 nm, there would be insufficient coverage for the mesa 203; if the thickness T3 is larger than about 5 nm, the channel layer usage rate may be reduced as the total height of the buffer semiconductor region 254 may become too large. If the distance T4 is less than 0 nm, the bottommost channel layer may also be covered; if the distance T4 is larger than about 5 nm, it may induce dopant diffusion into the mesa 203. If the thickness T5 is less than about 10 nm, the mesa 203 may not be sufficiently covered; if the thickness T5 is larger than about 50 nm, the production cost may be unnecessarily increased.

Figures 14A, 14B:
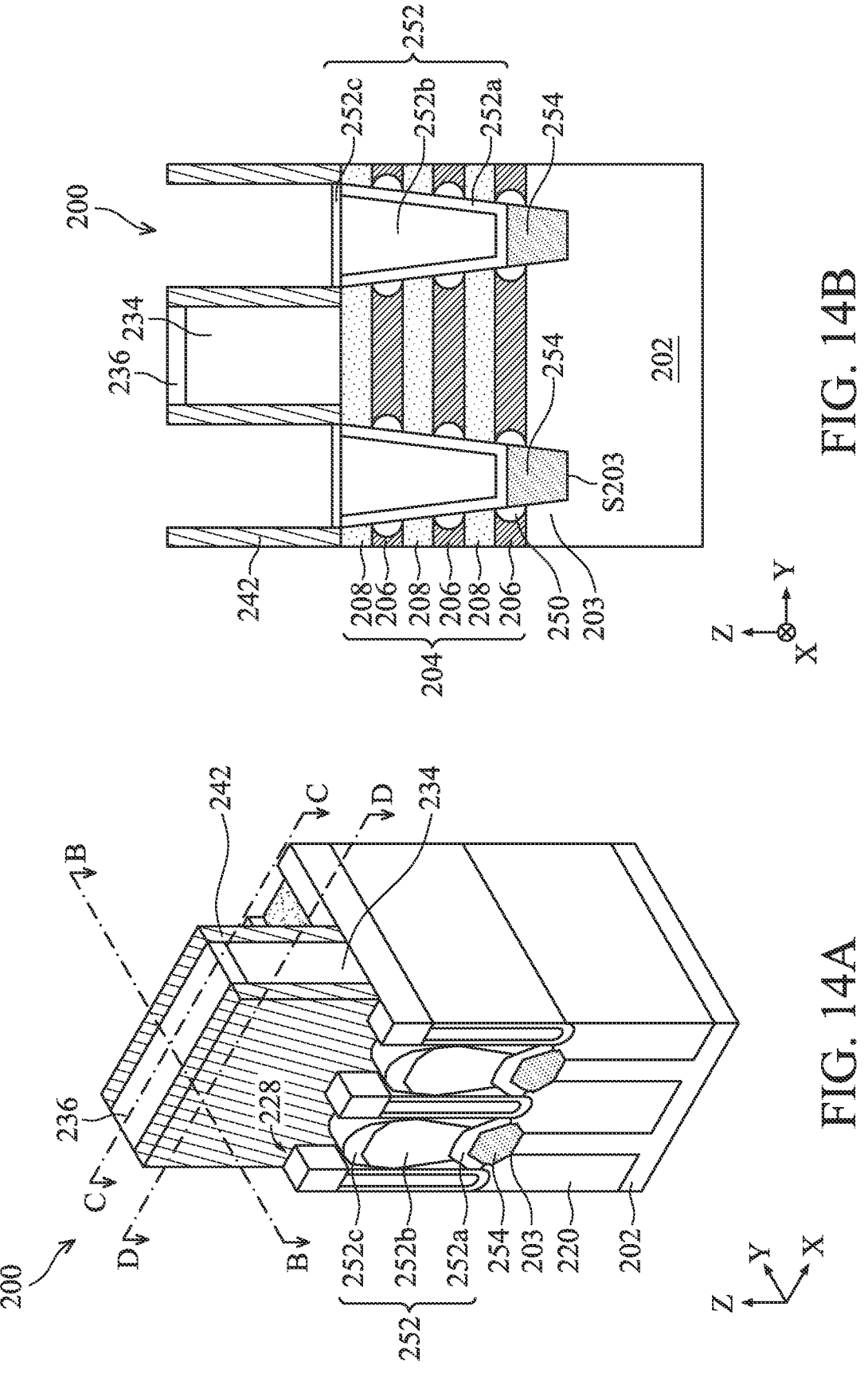

At operation 126, the method 100 (FIG. 1) forms S/D epitaxial features (also referred to as S/D features). With reference to FIGS. 14A-14D, S/D features 252 are formed in the S/D recesses 246. By way of example, epitaxial growth of the S/D features 252 may be performed by vapor-phase epitaxy (VPE), ultra-high vacuum CVD (UHV-CVD), molecular beam epitaxy (MBE), and/or other suitable processes. The S/D features 252 has the same crystalline orientation with the substrate 202 and the buffer semiconductor region 254. The S/D features 252 are formed in S/D regions adjacent to and on both sides of the dummy gate structure 234. For example, the S/D features 252 may be formed over the exposed mesa 203 of the semiconductor fins 210 and in contact with the adjacent inner spacers 250 and the channel layers (epitaxial layers 208). In the illustrated embodiment as shown in FIG. 14D, bottom portion of the S/D features 252 (i.e., epitaxial-grown doped layer 252a) is in contact with the dielectric fins 228, yet top and middle portions of the S/D features 252 (i.e., epitaxial-grown doped layers 252b and 252c) do not laterally expand enough to have contact with the dielectric fins 228. The dielectric fins 228 effectively prevents the lateral merging of adjacent S/D features 252 formed on the semiconductor fins 210.

On a whole, the S/D features 252 provides a tensile or compress stress to the channel regions. In various embodiments, the S/D features 252 may include Ge, Si, GaAs, AlGaAs, SiGe, GaAsP, SiP, or other suitable material. In some embodiments, the S/D features 252 are formed by epitaxially growing one or more semiconductor material layers (e.g., epitaxial-grown doped layers 252a, 252b, and 252c) in the S/D regions. In some embodiments, the first epitaxial-grown doped layer 252a makes contact with the buffer semiconductor region 254 and in contact with the bottommost inner spacer 250 and the bottommost channel layer 208, which is also regarded as epitaxial-grown doped liners to facilitate epitaxial growth of the subsequent epitaxial-grown doped layer 252b. The first epitaxial-grown doped layer 252a forms a U-shaped or a V-shaped structure in the S/D regions (FIG. 14B). The second epitaxial-grown doped layer 252b is located on the first epitaxial-grown doped layer 252a. The third epitaxial-grown doped layer 252c caps the first epitaxial-grown doped layer 252a and the second epitaxial-grown doped layer 252b. Top surfaces of the second and third epitaxial-grown doped layers 252b and 252c may be both above top surfaces of the dielectric layers 224 and 226 of the dielectric fins 228, but lower than the top surface of the high-k dielectric layer 230 of the dielectric fins 228. In some alternative embodiments, the top surface of the third epitaxial-grown doped layer 252c may be above the top surface of the high-k dielectric layer 230 of the dielectric fins 228.

In one embodiment, the first epitaxial-grown doped layer 252a is made of silicon germanium, which is the same as that of the second epitaxial-grown doped layer 252b. Further, the concentration of the germanium is increasingly grading from the first epitaxial-grown doped layer 252a to the second epitaxial-grown doped layer 252b. Specifically, the first epitaxial-grown doped layer 252a includes a germanium concentration (in molar ratio) in a range from about 15% to about 35%. The second epitaxial-grown doped layer 252b includes a germanium concentration in a range from about 35% to about 55%. The germanium concentration is adjustable to meet different requirements of strain. In addition, the first and second epitaxial-grown doped layers 252a and 252b individually include a gradient distribution. For example, first epitaxial-grown doped layer 252a increasingly grades from its bottommost to its topmost. The third epitaxial-grown doped layer 252c is made of silicon, which refers to a silicon cap layer making contact with and capping the first and second epitaxial-grown doped layers 252a and 252b. Alternatively, the third epitaxial-grown doped layer 252c is made of silicon germanium with a germanium concentration in a range from about 45% to about 50%. A thickness of the first epitaxial-grown doped layer 252a may range from about 5 nm to about 15 nm. A thickness of the second epitaxial-grown doped layer 252b may range from about 30 nm to about 60 nm. A thickness of the third epitaxial-grown doped layer 252c may range from about 5 nm to about 10 nm.

The S/D features 252 may be in-situ doped during the epitaxial process by introducing doping species including: p-type dopants, such as boron or $BF_2$; n-type dopants, such as phosphorus or arsenic; and/or other suitable dopants including combinations thereof. If the S/D features 252 are not in-situ doped, an implantation process (i.e., a junction implant process) is performed to dope the S/D features 252. In an exemplary embodiment, the S/D features 252 in an NMOS device include SiP, while those in a PMOS device include GeSnB and/or SiGeSnB. In one embodiment, the first epitaxial-grown doped layer 252a includes the same dopant species as the second and third epitaxial-grown doped layers 252b and 252c. The dopant concentration is increasingly grading from the first epitaxial-grown doped layer 252a to the third epitaxial-grown doped layer 252c. The third epitaxial-grown doped layer 252c includes a dopant concentration higher than those of the first and second epitaxial-grown doped layers 252a and 252b, which facilitate subsequent silicidation process (e.g., nickel silicide formation) for landing S/D contacts on the S/D features. The second epitaxial-grown doped layer 252b includes a dopant concentration higher than that of the first epitaxial-grown doped layer 252a. Further, the first, second, and third epitaxial-grown doped layers 252*a*, 252*b*, and 252*c* include a constant distribution of dopant concentration individually in some embodiments. For example, the second epitaxial-grown doped layer 252*b* includes a constant distribution where the dopant concentration is constant from its bottom-most to its topmost. The first epitaxial-grown doped layer 252*a* fully covers the buffer semiconductor region 254 but is separated from the mesa 203. In other words, the buffer semiconductor region 254 fully covers sidewalls of the mesa 203 with sufficient margin, such that the S/D features 252 is separated from the mesa 203 by the buffer semiconductor region 254 for a distance that is sufficient to prevent dopants diffusing into the mesa 203.

Figures 15A, 15B:
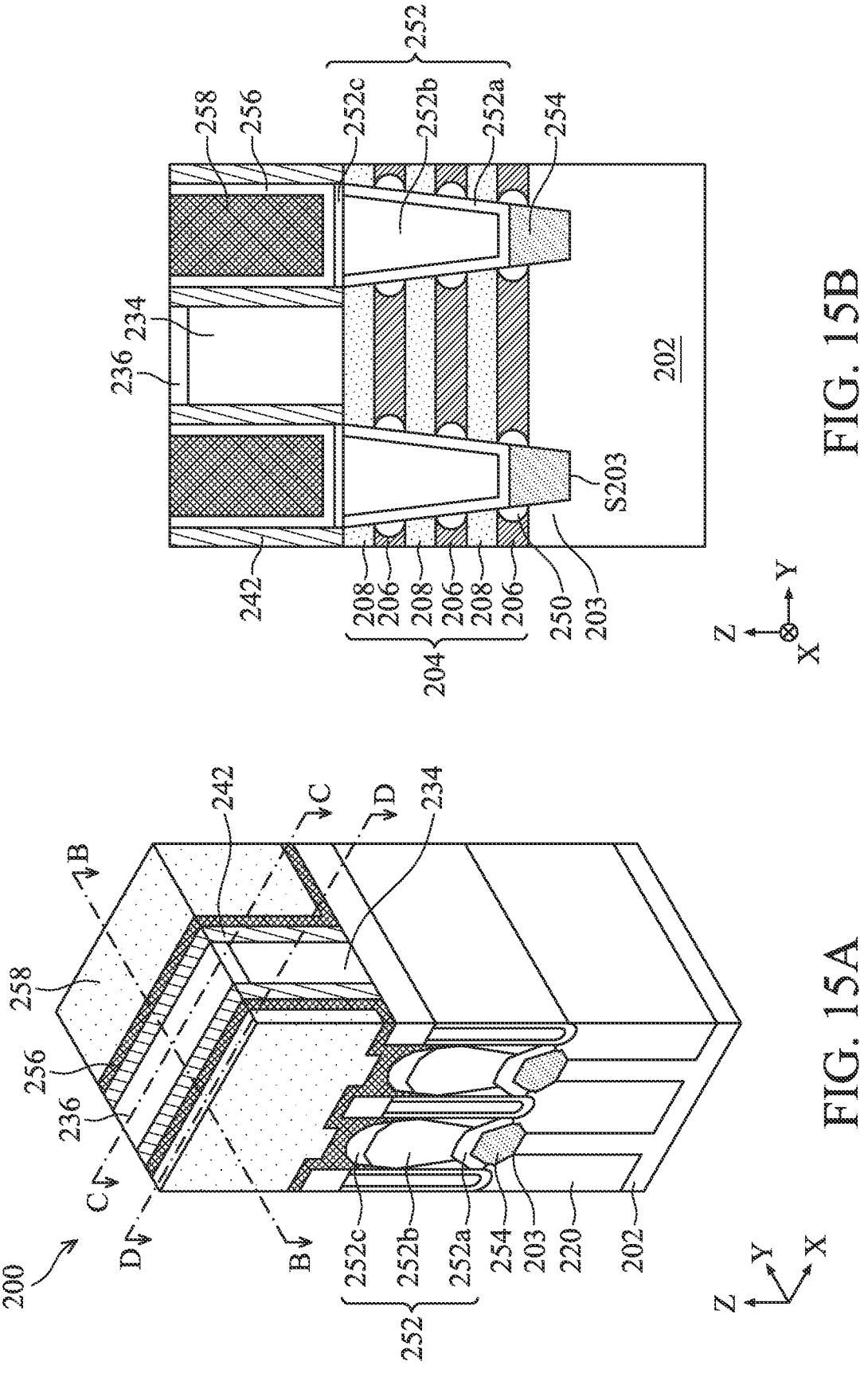
Figure 15D:
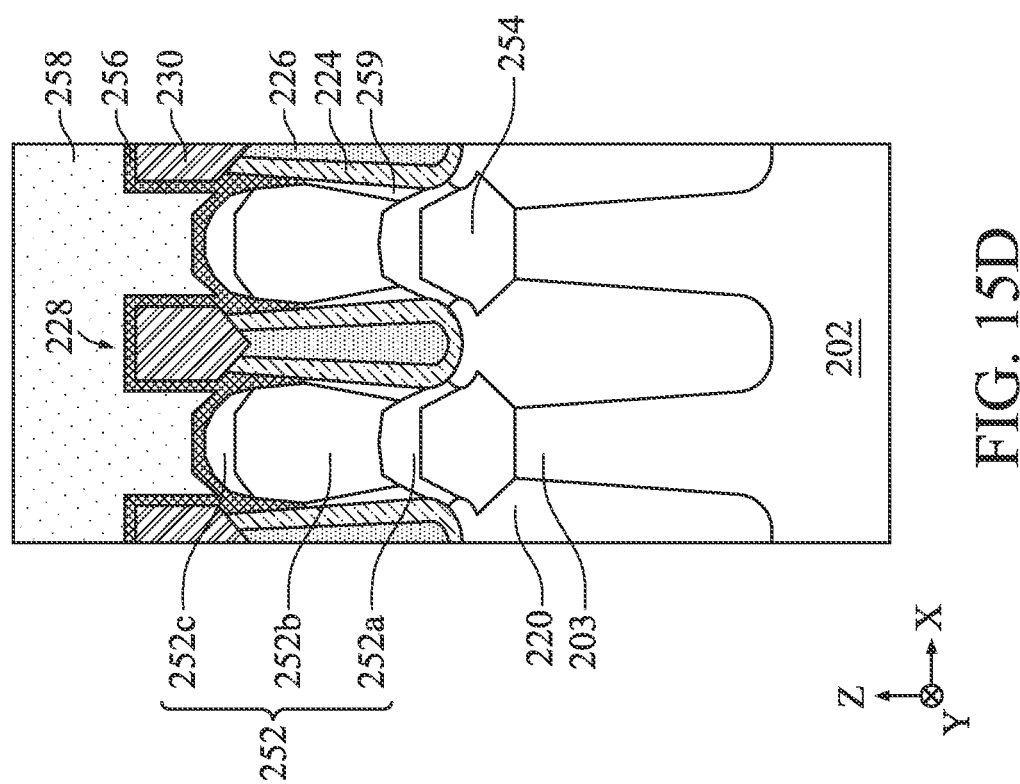
Figure 15C:
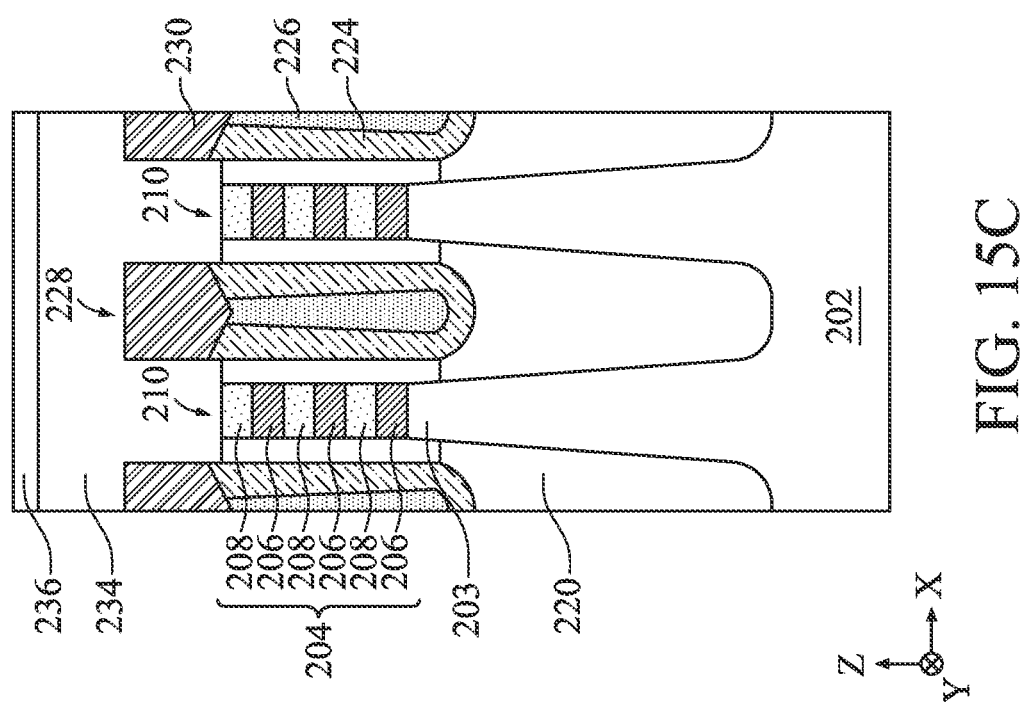
Figures 16A, 16B:
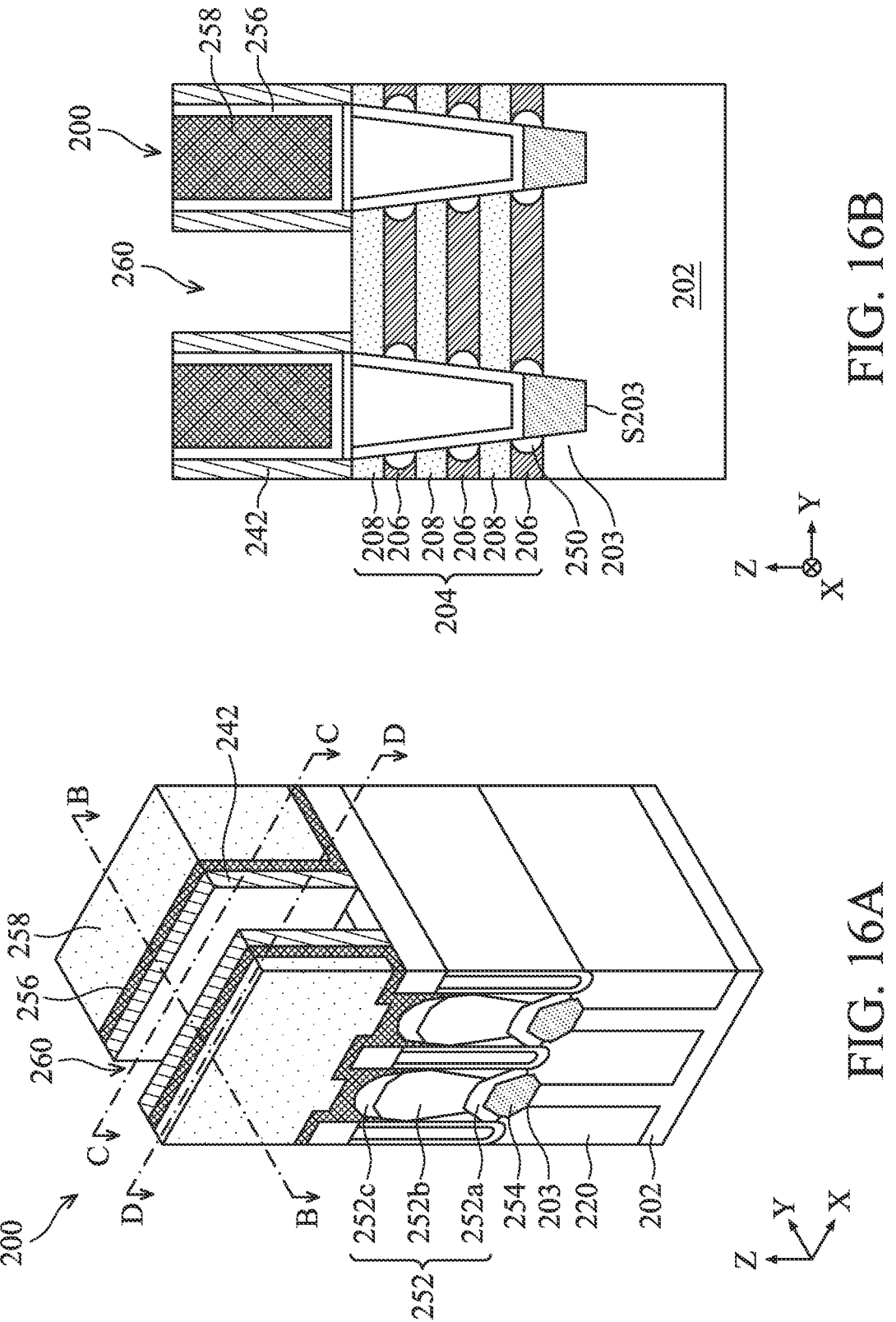
Figure 16D:
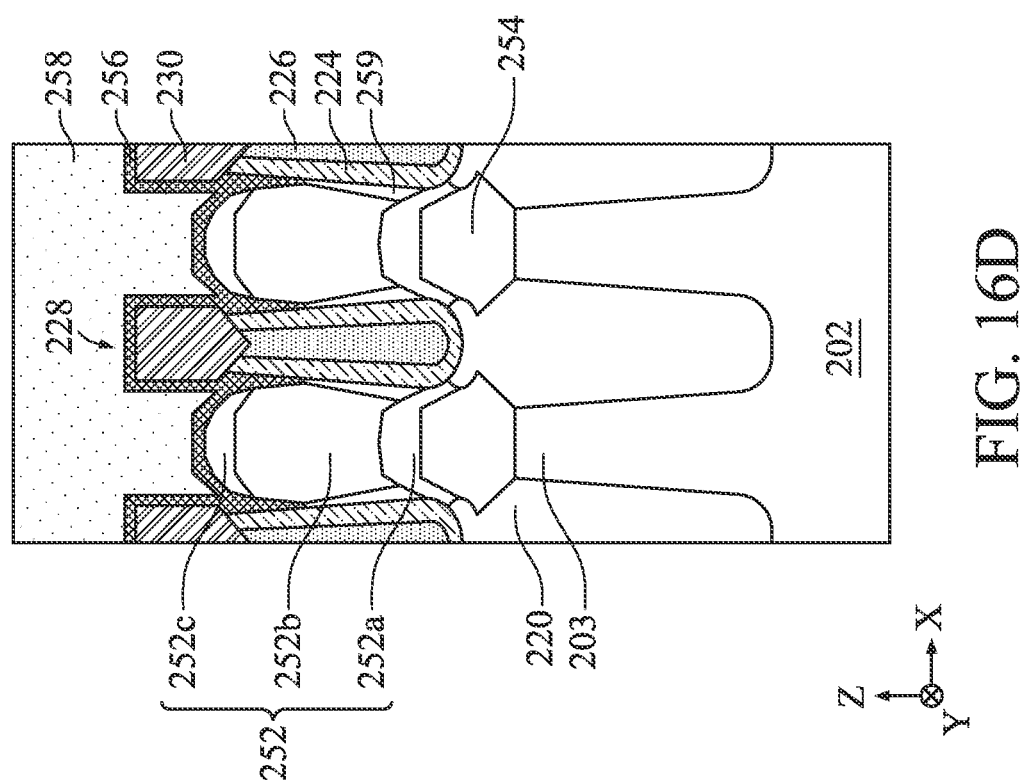
Figure 16C:
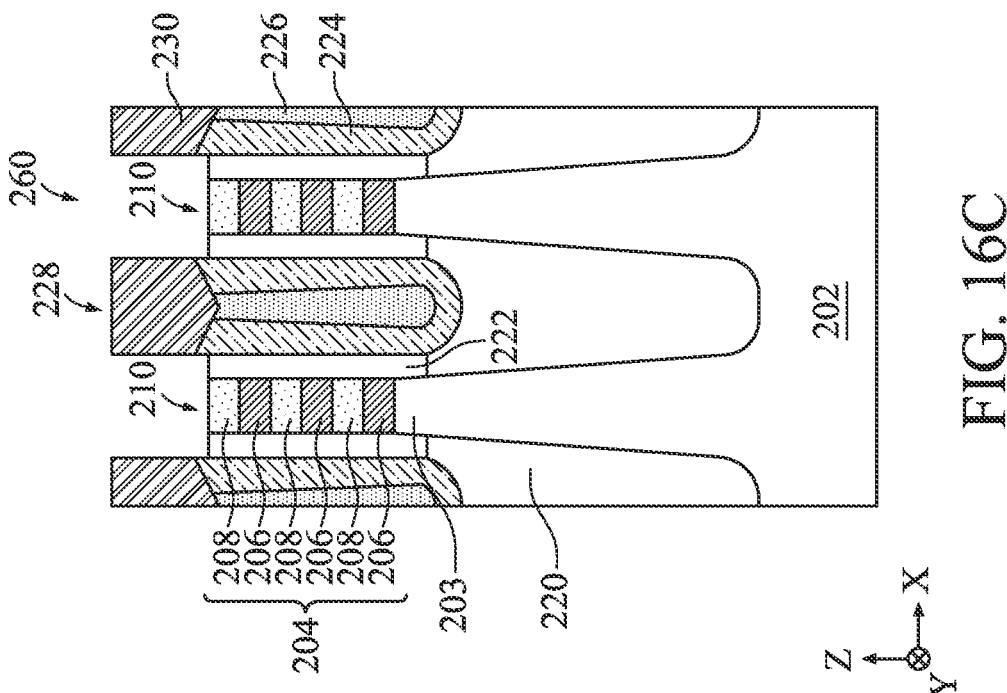
Figure 17B:
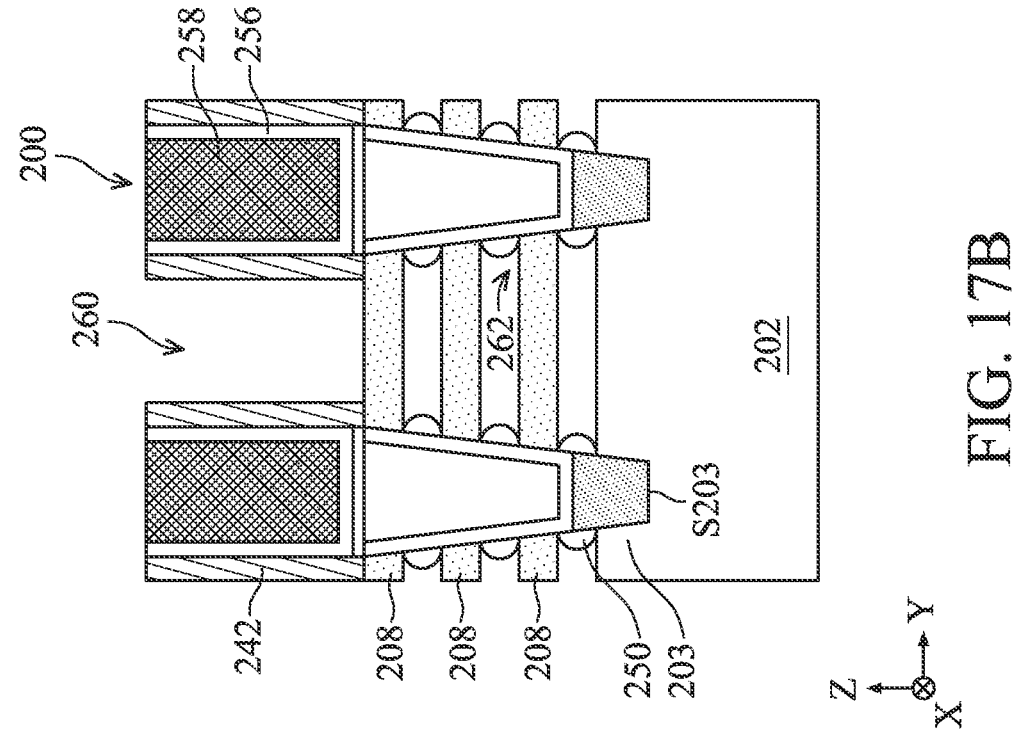
Figure 17A:
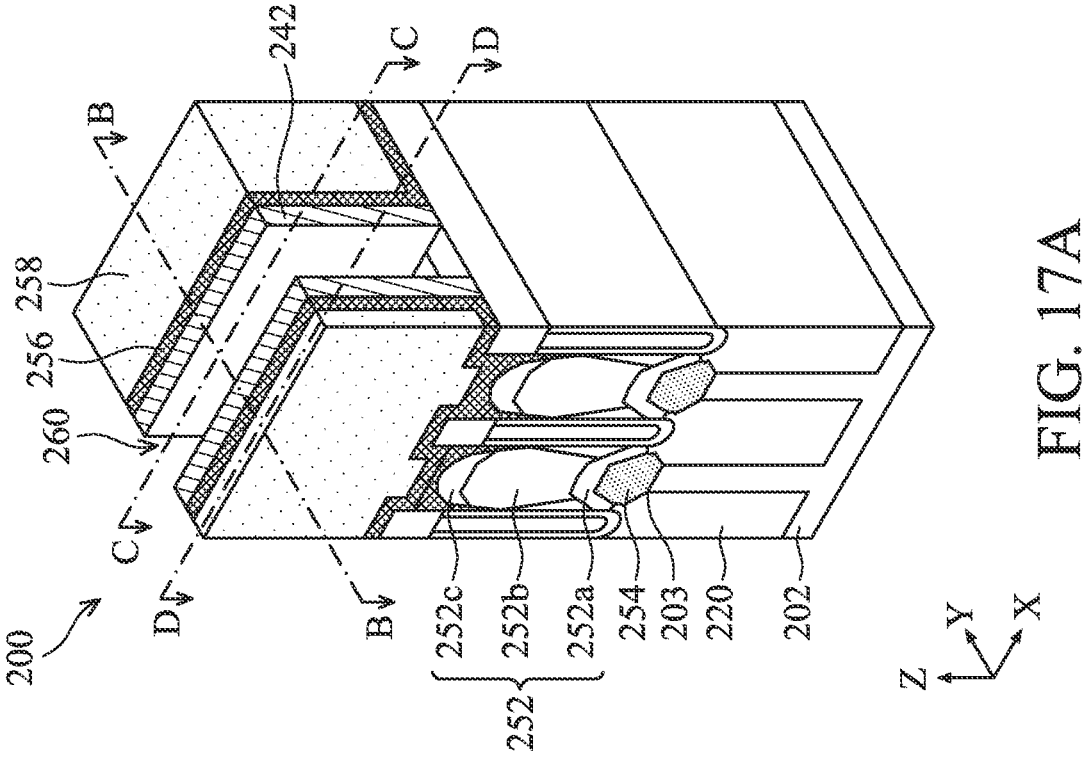
Figure 17D:
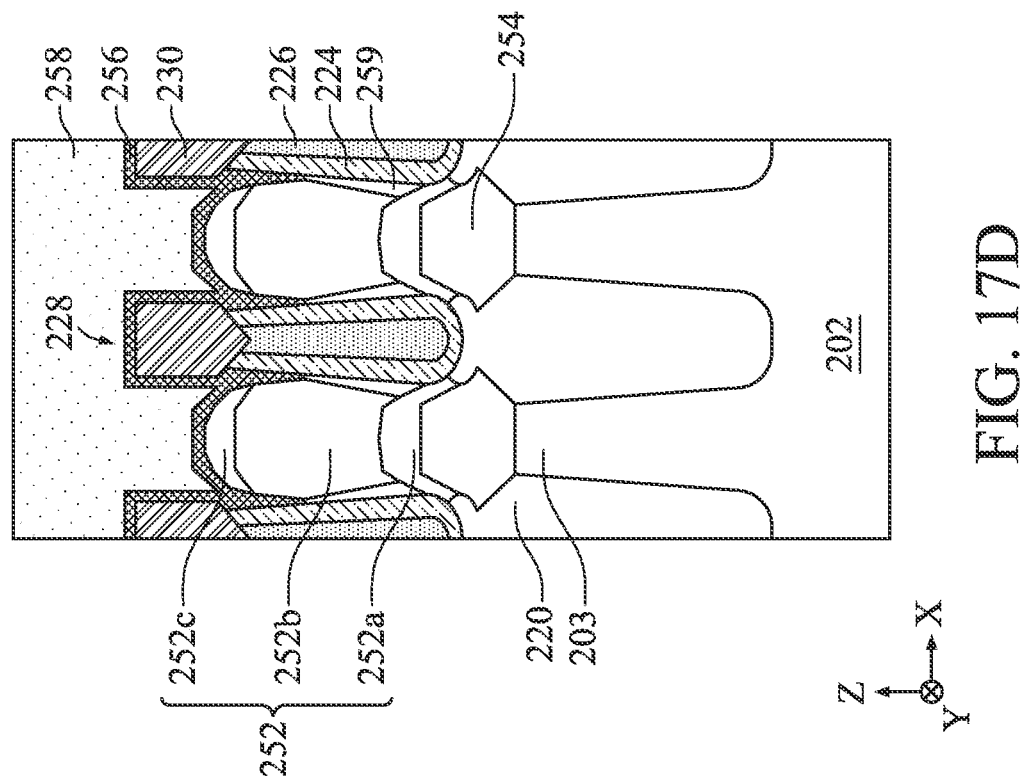
Figure 17C:
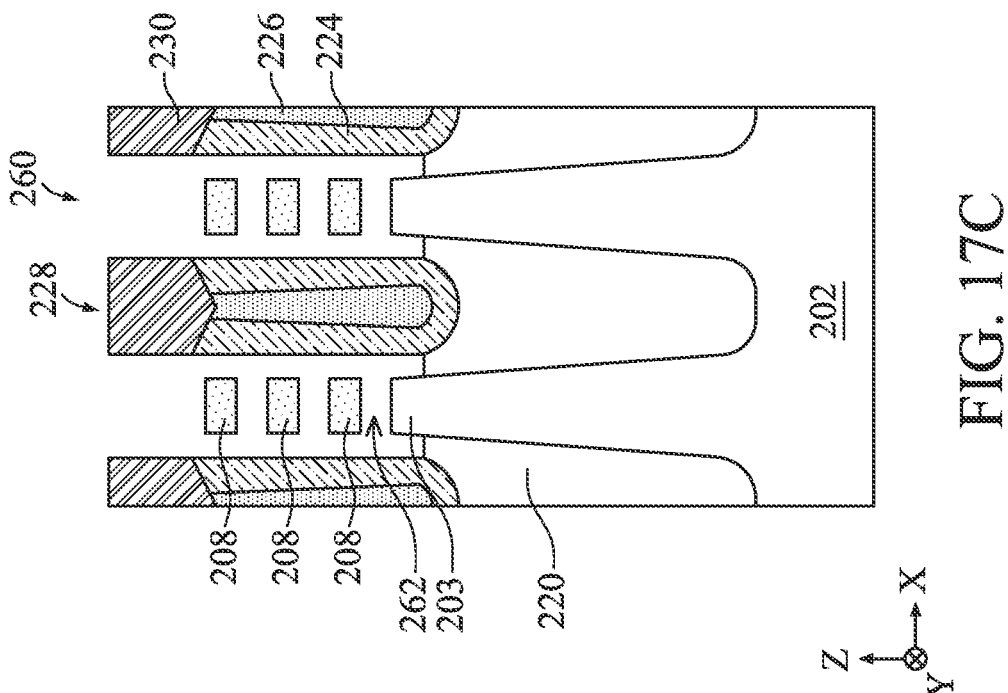

At operation 128, the method 100 (FIG. 1) forms a contact etch stop layer (CESL) and an inter-layer dielectric (ILD) layer. With reference to FIGS. 15A-15D, a CESL 256 is deposited over the S/D features 252 and the gate spacers 242, and an ILD layer 258 is deposited over the CESL 256. In some embodiments of operation 128, the CESL 256 includes a silicon nitride layer, silicon oxide layer, a silicon oxynitride layer, and/or other materials known in the art. The CESL 256 may be formed by plasma-enhanced chemical vapor deposition (PECVD) process and/or other suitable deposition or oxidation processes. In some embodiments, the ILD layer 258 includes materials such as tetraethylortho-silicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 258 may be deposited by a PECVD process or other suitable deposition technique. In some embodiments, after formation of the ILD layer 258, the semiconductor device 200 may be subject to a high thermal budget process to anneal the ILD layer. Referring to FIG. 15D, in the illustrated embodiment, the CESL 256, the first epitaxially-grown doped layer 252*a*, the second epitaxially-grown doped layer 252*b*, and the dielectric layer 224 of the dielectric fin 228 collectively trap voids (gaps) 259 under the CESL 256 (also under the third epitaxially-grown doped layer 252*c*). The voids 259 may be filled with ambient environment conditions (e.g., air, nitrogen).

In some examples, after depositing the ILD layer 258, a planarization process may be performed to remove excessive dielectric materials. For example, a planarization process includes a chemical mechanical planarization (CMP) process which removes portions of the ILD layer 258 (and CESL 256, if present) overlying the dummy gate structure 234 and planarizes a top surface of the semiconductor device 200. In some embodiments, the CMP process also removes the hard mask 236 and exposes the dummy electrode layer of the dummy gate structure 234.

At operation 130, the method 100 (FIG. 1) removes the dummy gate structure 234 to form a gate trench 260. With reference to FIGS. 16A-16D, the dummy gate structure 234 is removed to expose top surfaces of the dielectric fins 228, the semiconductor fins 210, and the cladding layer 222 in the gate trench 260. Sidewalls of the high-k dielectric layer 230 of the dielectric fins 228 are exposed in the gate trench 260 as well. Operation 130 may include one or more etching processes that are selective to the material in the dummy gate structure 234. For example, recessing the dummy gate structure 234 may be performed using a selective etch process such as a selective wet etch, a selective dry etch, or a combination thereof. A final gate structure (e.g., a high-k metal gate stack) may be subsequently formed in the gate trench 260, as will be described below.

At operation 132, the method 100 (FIG. 1) removes the epitaxial layers 206 from the semiconductor fins 210 and the cladding layer 222 from the gate trench 260. The resultant structure is shown in FIGS. 17A-17D. In an embodiment, the epitaxial layers 206 and the cladding layer 222 both include SiGe and the epitaxial layers 208 are silicon, allowing for the selective removal of the epitaxial layers 206 and the cladding layer 222. In an embodiment, the epitaxial layers 206 and the cladding layer 222 are removed by a selective wet etching process. In some embodiments, the selective wet etching includes an APM etch (e.g., ammonia hydroxide-hydrogen peroxide-water mixture). In some embodiments, the selective removal includes SiGe oxidation followed by a SiGeOx removal. For example, the oxidation may be provided by $O_3$ clean and then SiGeOx removed by an etchant such as $NH_4OH$. It is noted that during the interim processing stage of operation 138, gaps 262 are provided between the adjacent channel members (e.g., nanowires or nanosheet) in the channel region (e.g., gaps 262 between epitaxial layers 208). The gaps 262 may be filled with ambient environment conditions (e.g., air, nitrogen).

The method 100 then proceeds to operation 134 (FIG. 1) where a gate structure is formed. The gate structure may be the gate of one or more multi-gate transistors. The gate structure may be a high-k metal gate (HK MG) stack, however other compositions are possible. In some embodiments, the gate structure forms the gate associated with the multi-channels provided by the plurality of channel members (e.g., nanosheets or nanowires having gaps therebetween) in the channel region. The resultant structure is shown in FIGS. 18A-18D. In an embodiment of operation 138, a HK MG stack 270 is formed within the gate trench 260 of the device 200 provided by the release of the epitaxial layers 208, described above with reference to prior operation 132. In various embodiments, the HK MG stack 270 includes an interfacial layer (not shown), a high-K gate dielectric layer 272 formed over the interfacial layer, and a gate electrode layer 274 formed over the high-k gate dielectric layer 272. High-k gate dielectrics, as used and described herein, include dielectric materials having a high dielectric constant, for example, greater than that of thermal silicon oxide (~3.9). The gate electrode layer used within HK MG stack may include a metal, metal alloy, or metal silicide. Additionally, the formation of the HK MG stack may include depositions to form various gate materials, one or more liner layers, and one or more CMP processes to remove excessive gate materials and thereby planarize a top surface of the semiconductor device 200. Interposing the HK MG stack 270 and the S/D features 252 are the inner spacers 250, providing isolation.

Figure 18B:
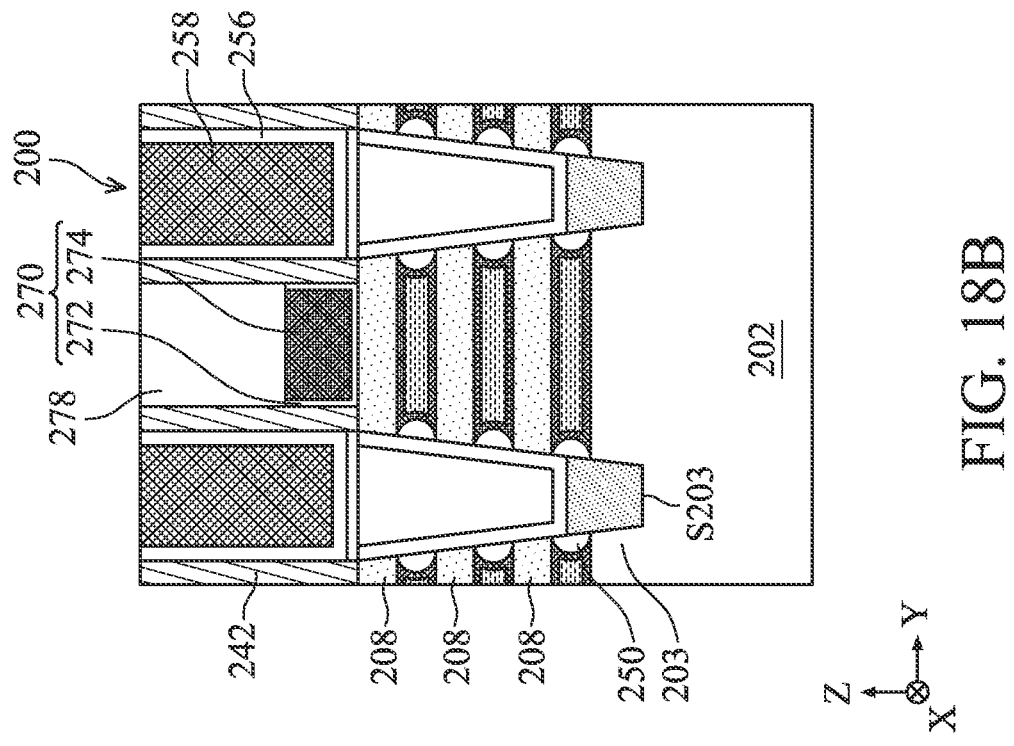
Figure 18A:
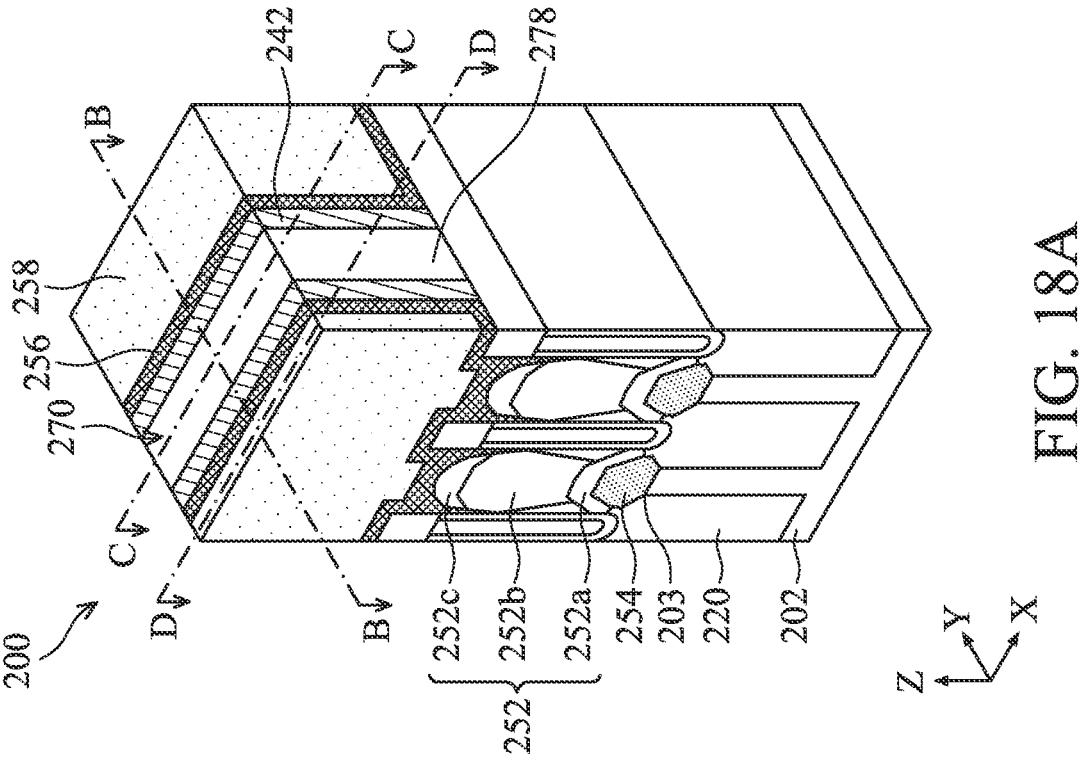
Figure 18D:
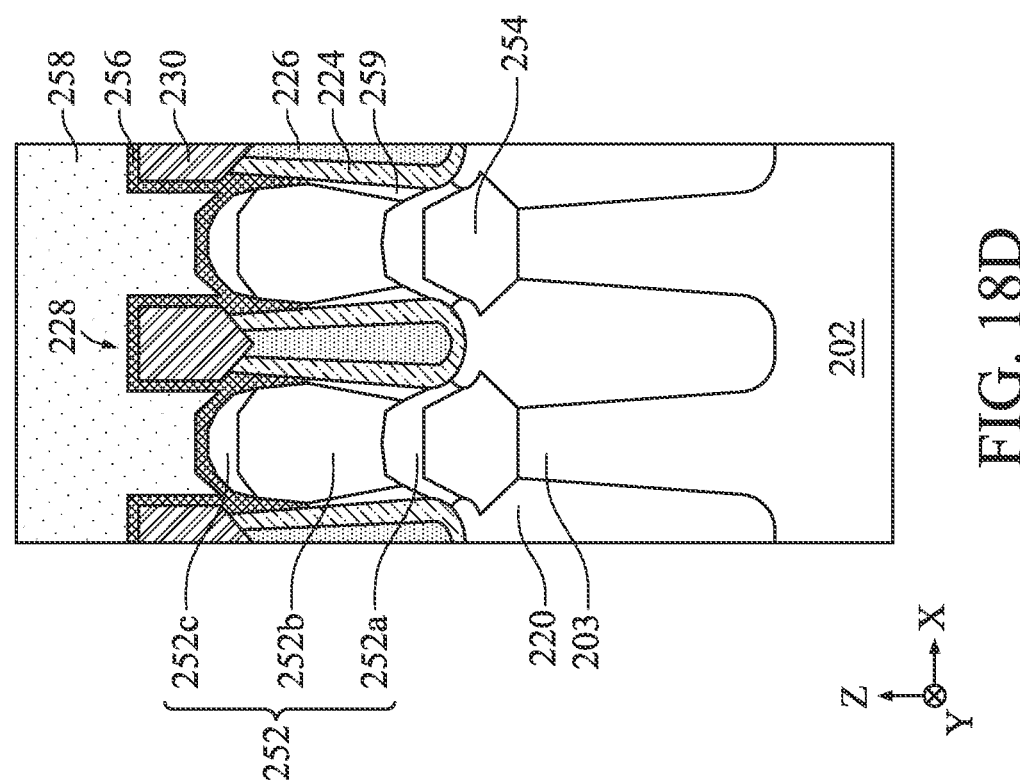
Figure 18C:
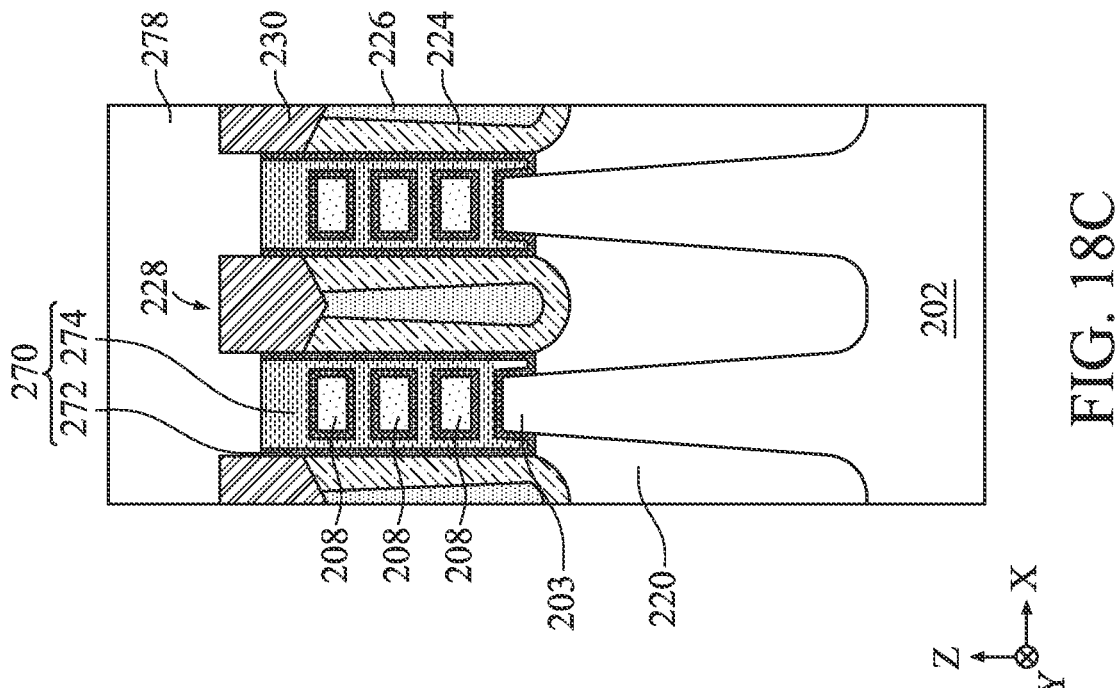
Figure 19B:
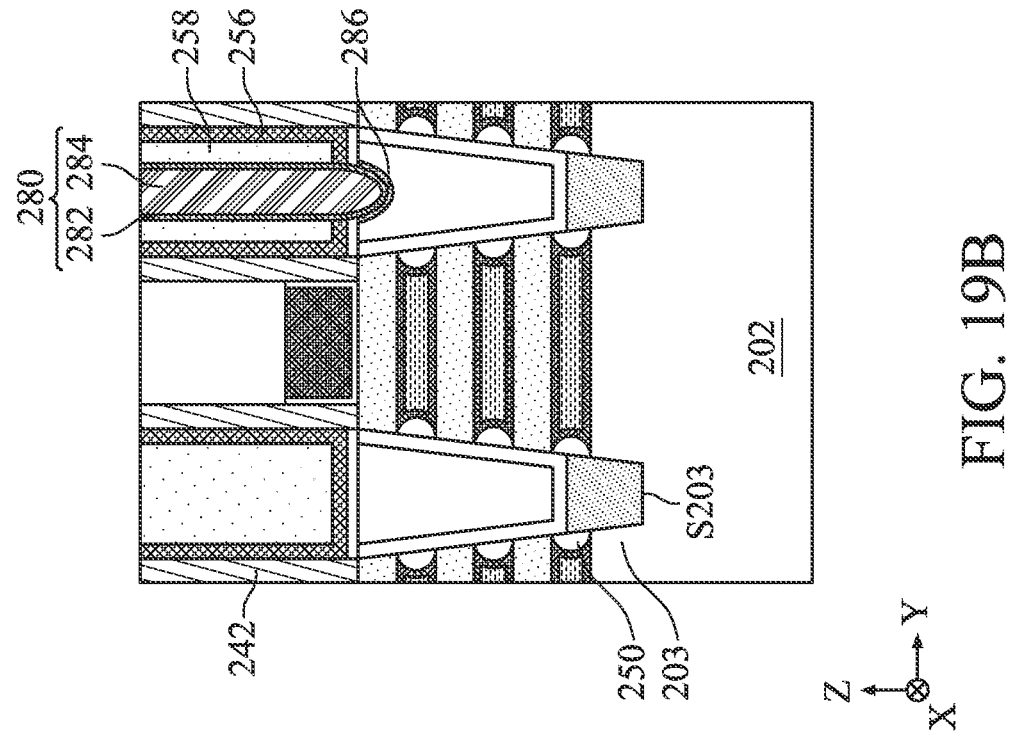
Figure 19A:
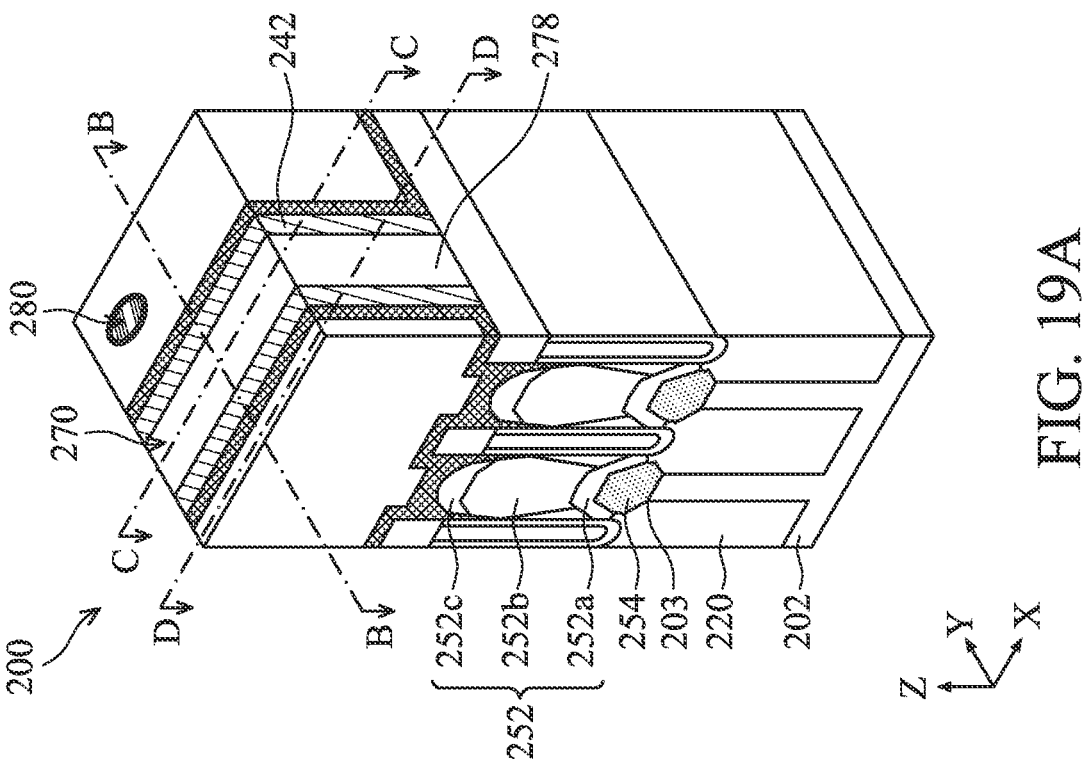
Figure 19D:
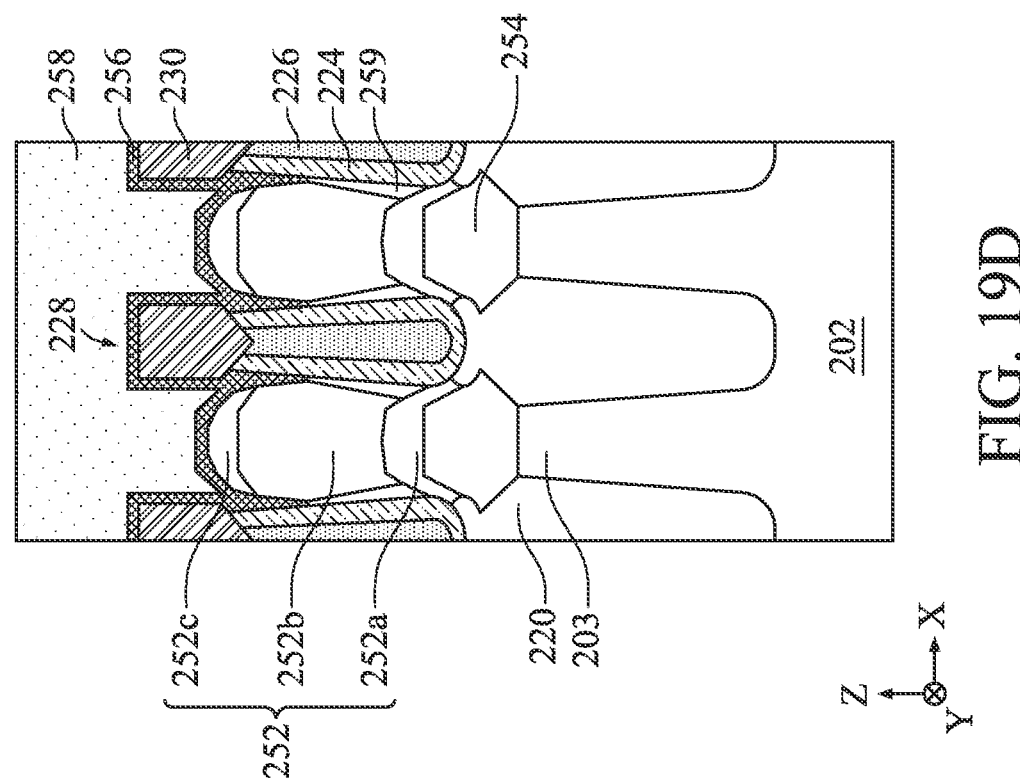
Figure 19C:
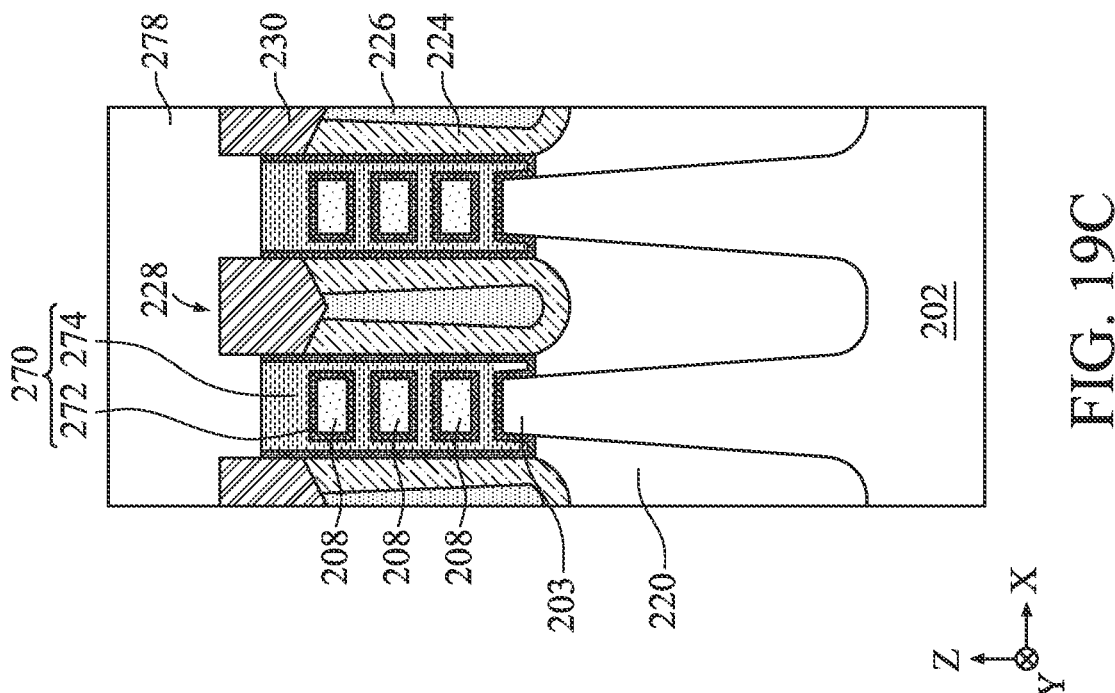

The HK MG stack 270 includes portions that interpose each of the epitaxial layers (channel members) 208, which form channels of the multi-gate device 200. In some embodiments, the interfacial layer of the HK MG stack 270 may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The high-k gate dielectric layer 272 of the HK MG stack 270 may include a high-K dielectric such as hafnium oxide ($HfO_2$). Alternatively, the high-k gate dielectric layer 272 of the HK MG stack 270 may include other high-K dielectrics, such as $TiO_2$, $HfZrO$, $Ta_2O_3$, $HfSiO_4$, $ZrO_2$, $ZrSiO_2$, LaO, $A_{10}$, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The high-k gate dielectric layer 272 may be formed by ALD, physical vapor deposition (PVD), CVD, oxidation, and/or other suitable methods. As illustrated in FIGS. 18B and 18C, in some embodiments, the high-k gate dielectric layer 272 is deposited conformally on sidewalls of the dielectric fin 228, the inner spacers 250, and top surfaces of the STI features 220.

The gate electrode layer 274 of the HK MG stack 270 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer 274 of HK MG stack 270 may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In various embodiments, the gate electrode layer 274 of the HK MG stack 270 may be formed by ALD, PVD, CVD, e-beam evaporation, or other suitable process. Further, the gate electrode layer 274 may be formed separately for N-FET and P-FET transistors which may use different metal layers (e.g., for providing an N-type or P-type work function).

Referring to FIG. 18C, in the illustrated embodiment, the HK MG stack 270 may be etched back so that the top surface of the HK MG stack 270 is lower than the top surfaces of the dielectric fins 228, for example, about 2 nm to about 10 nm lower. The dielectric fins 228 on both sides of each HK MG stack 270 function as gate isolation features that isolate the HK MG stack 270 from other adjacent gate stacks. The portion of the etched-back HK MG stack 270 above the top epitaxial layer 208 may have a thickness ranging from about 10 nm to about 20 nm. After the etching back of the HK MG stack 270, a self-aligned cap (SAC) layer 278 is deposited over the device 200 by CVD, PECVD, or a suitable deposition process. The SAC layer 278 may include silicon oxide, silicon nitride, silicon carbide, silicon carbonitride, silicon oxynitride, silicon oxycarbonitride, aluminum oxide, aluminum nitride, aluminum oxynitride, zirconium oxide, zirconium nitride, zirconium aluminum oxide, hafnium oxide, or a suitable dielectric material. In various embodiments, a CMP process may be performed to remove excessive metal from the SAC layer 278, and thereby provide a substantially planar top surface of the device 200.

Optionally, the middle dielectric fin 228 as shown in FIG. 18C may be recessed (for example, by removing the high-k dielectric layer 230), such as after the gate trench 260 is formed and prior to the deposition of the HK MG stack 270, allowing the HK MG stack 270 to straddle the middle dielectric fin 228 and engages two stacks (or more) of channel members 208 on both sides of the middle dielectric fin 228. In such a configuration, the two transistors share the same gate stack. The HK MG stack 270 is also referred to as a joint gate stack.

The device 200 may undergo further processing to form various features and regions known in the art. For example, subsequent processing may form contact openings, contact metal, as well as various contacts/vias/lines and multilayers interconnect features (e.g., metal layers and interlayer dielectrics), configured to connect the various features to form a functional circuit that may include one or more multi-gate devices. With reference to FIGS. 19A-19D, S/D contact(s) 280 may be formed above one or more S/D features 252. In an example process, a contact hole may be formed by lithography and etching processes, exposing the S/D feature 252 in the contact hole. A silicide feature (e.g., TiSi) 286 is formed on the exposed top surface of the S/D feature 252. The silicide feature 286 may have a thickness from about 3 nm to about 10 nm. A barrier layer (e.g., TiN) 282 is blanket deposited in the contact hole. The barrier layer 282 may have a thickness from about 2 nm to about 5 nm. Subsequentially, a conductive material, such as copper or tungsten, is deposited in the contact hole to form the metal fill 284 of the S/D contact 280. The S/D feature 252 may have a width measured in the Y-axis from about 20 nm to about 60 nm, and the S/D contact 280 may have a width measured in the Y-axis from about 10 nm to about 40 nm. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 100, and some process steps described above may be replaced or eliminated in accordance with various embodiments of the method 100.

One of ordinary skill may recognize although FIGS. 2A-19D illustrate GAA devices as embodiments, other examples of semiconductor devices may benefit from aspects of the present disclosure, such as FinFET devices.

Although not intended to be limiting, one or more embodiments of the present disclosure provide many benefits to a semiconductor device and the formation thereof. For example, embodiments of the present disclosure provide a multi-gate device with a buffer semiconductor region formed on a (110) substrate. The epitaxial growth from the (110) substrate allows the buffer semiconductor region having a profile suitable for blocking dopants in subsequently formed source/drain features from diffusing into a mesa region of the multi-gate device, which suppresses the substrate leakage current through the mesa region. Furthermore, the formation of the buffer semiconductor region can be easily integrated into existing semiconductor fabrication processes.

In one exemplary aspect, the present disclosure is directed to a method. The method includes forming a semiconductor fin protruding from a semiconductor substrate, the semiconductor fin having an epitaxial portion and a mesa portion under the epitaxial portion, the epitaxial portion having a plurality of channel layers interleaved with a plurality of sacrificial layers, the semiconductor substrate having a top surface in (110) crystal plane, forming a dummy gate structure across the semiconductor fin, removing at least the epitaxial portion of the semiconductor fin in a region adjacent the dummy gate structure, thereby forming a recess, epitaxially growing a buffer semiconductor region in the recess, the buffer semiconductor region having a top surface in (110) crystal plane, epitaxially growing a source/drain feature on the buffer semiconductor region, and replacing the dummy gate structure with a metal gate structure. In some embodiments, the buffer semiconductor region has a facet in (111) crystal plane. In some embodiments, an angle formed between the facet and a normal direction to the top surface of the semiconductor substrate ranges from about 5° to about 35.5°. In some embodiments, the recess exposes a sidewall of the mesa portion under the dummy gate structure, and wherein the buffer semiconductor region fully covers the sidewall of the mesa portion. In some embodiments, viewing in a lengthwise direction of the semiconductor fin, the buffer semiconductor region partially overlaps with a bottommost sacrificial layer. In some embodiments, the buffer semiconductor region partially overlaps with the bottommost sacrificial layer for a thickness from about 1 nm to about 5 nm. In some embodiments, a dopant concentration of the buffer semiconductor region is less than the semiconductor substrate and the source/drain feature. In some embodiments, the buffer semiconductor region is substantially free of dopants. In some embodiments, the buffer semiconductor region is essentially of silicon. In some embodiments, the method further includes forming inner spacers interposing the source/drain feature and the metal gate structure, wherein the buffer semiconductor region is in physical with a bottommost inner spacer.

In another exemplary aspect, the present disclosure is directed to a method. The method includes forming a semiconductor fin protruding from a substrate that has a top surface in (110) crystal plane, forming a cladding layer on sidewalls of the semiconductor fin, forming first and second dielectric fins on sidewalls of the cladding layer, forming a dummy gate structure on the semiconductor fin and the first and second dielectric fins, recessing the semiconductor fin in a region adjacent to the dummy gate structure to form a recess, laterally recessing the cladding layer and a portion of the semiconductor fin exposed in the recess, thereby forming cavities, depositing dielectric spacers in the cavities, growing a buffer epitaxial layer in the recess and sandwiched by the first and second dielectric fins, the buffer epitaxial layer having a top surface in (110) crystal plane, the buffer epitaxial layer in physical contact with a bottommost dielectric spacer, growing a source/drain feature on the buffer epitaxial layer that includes a plurality of epitaxial layers of different dopant concentrations, depositing a dielectric layer over the source/drain feature, and replacing the dummy gate structure with a metal gate structure. In some embodiments, the semiconductor fin includes channel layers and sacrificial layers alternatingly disposed in a vertical direction, and a top surface of the buffer epitaxial layer is below a bottom surface of a bottommost channel layer. In some embodiments, the buffer epitaxial layer has a thickness from about 10 nm to about 50 nm. In some embodiments, the buffer epitaxial layer includes a facet in (111) crystal plane, and an angle between the facet and a vertical direction ranges from about 5° to about 35.5°. In some embodiments, the buffer epitaxial layer is free of contact with the first and second dielectric fins. In some embodiments, the buffer epitaxial layer is undoped. In some embodiments, the dielectric layer traps an air gap under a topmost epitaxial layer of the source/drain feature.

In yet another exemplary aspect, the present disclosure is directed to a semiconductor device. The semiconductor device includes channel members vertically stacked above a substrate, a conductive structure wrapping around each of the channel members, an epitaxial feature abutting the channel members, inner spacers interposing the epitaxial feature and the conductive structure, and an undoped semiconductor region vertically stacked between the substrate and the epitaxial feature, top surfaces of the substrate and the undoped semiconductor region being both in (110) crystal plane. In some embodiments, the semiconductor device further includes a mesa region directly under the channel members, the undoped semiconductor region separating the epitaxial feature from physically contacting the mesa region. In some embodiments, the undoped semiconductor region partially overlaps a bottommost inner spacer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a semiconductor fin protruding from a semiconductor substrate, the semiconductor fin having an epitaxial portion and a mesa portion under the epitaxial portion, the epitaxial portion having a plurality of channel layers interleaved with a plurality of sacrificial layers, the semiconductor substrate having a top surface in (110) crystal plane;
   forming a dummy gate structure across the semiconductor fin;
   removing at least the epitaxial portion of the semiconductor fin in a region adjacent the dummy gate structure, thereby forming a recess;
   epitaxially growing a buffer semiconductor region in the recess, the buffer semiconductor region having a top surface in (110) crystal plane and a facet in (111) crystal plane;
   epitaxially growing a source/drain feature on the buffer semiconductor region; and
   replacing the dummy gate structure with a metal gate structure.

2. The method of claim 1, wherein an angle formed between the facet and a normal direction to the top surface of the semiconductor substrate ranges from about 5° to about 35.5°.

3. The method of claim 1, wherein the recess exposes a sidewall of the mesa portion under the dummy gate structure, and wherein the buffer semiconductor region fully covers the sidewall of the mesa portion.

4. The method of claim 1, wherein viewing in a lengthwise direction of the semiconductor fin, the buffer semiconductor region partially overlaps with a bottommost sacrificial layer.

5. The method of claim 4, wherein the buffer semiconductor region partially overlaps with the bottommost sacrificial layer for a thickness from about 1 nm to about 5 nm.

6. The method of claim 1, wherein a dopant concentration of the buffer semiconductor region is less than the semiconductor substrate and the source/drain feature.

7. The method of claim 1, wherein the buffer semiconductor region is substantially free of dopants.

8. The method of claim 1, wherein the buffer semiconductor region is essentially of silicon.

9. The method of claim 1, further comprising:
   forming inner spacers interposing the source/drain feature and the metal gate structure, wherein the buffer semiconductor region interfaces with a bottommost inner spacer.

10. The method of claim 1, wherein the buffer semiconductor region has a thickness from about 10 nm to about 50 nm.

11. A method, comprising:
   forming a semiconductor fin protruding from a substrate, the substrate having a top surface in (110) crystal plane;
   forming a cladding layer on sidewalls of the semiconductor fin;
   forming first and second dielectric fins on sidewalls of the cladding layer;

forming a dummy gate structure on the semiconductor fin and the first and second dielectric fins;

recessing the semiconductor fin in a region adjacent to the dummy gate structure, thereby forming a recess;

laterally recessing the cladding layer and a portion of the semiconductor fin exposed in the recess, thereby forming cavities;

depositing dielectric spacers in the cavities;

growing a buffer epitaxial layer in the recess and sandwiched by the first and second dielectric fins, the buffer epitaxial layer having a top surface in (110) crystal plane, the buffer epitaxial layer in physical contact with a bottommost dielectric spacer;

growing a source/drain feature on the buffer epitaxial layer, the source/drain feature including a plurality of epitaxial layers of different dopant concentrations;

depositing a dielectric layer over the source/drain feature; and replacing the dummy gate structure with a metal gate structure.

12. The method of claim 11, wherein the semiconductor fin includes channel layers and sacrificial layers alternatingly disposed in a vertical direction, and wherein a top surface of the buffer epitaxial layer is below a bottom surface of a bottommost channel layer.

13. The method of claim 11, wherein the buffer epitaxial layer has a thickness from about 10 nm to about 50 nm.

14. The method of claim 11, wherein the buffer epitaxial layer includes a facet in (111) crystal plane, and wherein an angle between the facet and a vertical direction ranges from about 5° to about 35.5°.

15. The method of claim 11, wherein the buffer epitaxial layer is free of contact with the first and second dielectric fins.

16. The method of claim 11, wherein the buffer epitaxial layer is undoped.

17. The method of claim 11, wherein the dielectric layer traps an air gap under a topmost epitaxial layer of the source/drain feature.

18. A method, comprising:

forming a semiconductor fin protruding from a substrate, the substrate having a top surface in (110) crystal plane;

forming a cladding layer on sidewalls of the semiconductor fin;

forming first and second dielectric fins on sidewalls of the cladding layer;

forming a dummy gate structure on the semiconductor fin and the first and second dielectric fins;

recessing the semiconductor fin in a region adjacent to the dummy gate structure, thereby forming a recess;

growing a buffer epitaxial layer in the recess and sandwiched by the first and second dielectric fins, the buffer epitaxial layer having a top surface in (110) crystal plane and a facet in (111) crystal plane;

growing a source/drain feature on the buffer epitaxial layer;

depositing a dielectric layer over the source/drain feature; and replacing the dummy gate structure with a metal gate structure, the metal gate structure comprising a titanium-containing material.

19. The method of claim 18, wherein the source/drain feature includes at least two epitaxial layers of different dopant concentrations, and one of the two epitaxial layers interposes the buffer epitaxial layer and one of the first and second dielectric fins.

20. The method of claim 18, wherein the buffer epitaxial layer has a thickness from about 10 nm to about 50 nm, and wherein an angle between the facet and a vertical direction ranges from about 5° to about 35.5°.

* * * * *